(12) United States Patent
Li et al.

(10) Patent No.: US 10,985,951 B2
(45) Date of Patent: Apr. 20, 2021

(54) INTEGRATING VOLTERRA SERIES MODEL AND DEEP NEURAL NETWORKS TO EQUALIZE NONLINEAR POWER AMPLIFIERS

(71) Applicant: The Research Foundation for the State University of New York, Binghamton, NY (US)

(72) Inventors: Xiaohua Li, Johnson City, NY (US); Robert Thompson, Quakertown, PA (US)

(73) Assignee: The Research Foundation for the State University, Binghamton, NY (US)

( * ) Notice: Subject to any disclaimer, the term of this patent is extended or adjusted under 35 U.S.C. 154(b) by 0 days.

(21) Appl. No.: 16/812,229

(22) Filed: Mar. 6, 2020

(65) Prior Publication Data
US 2020/0295975 A1 Sep. 17, 2020

Related U.S. Application Data

(60) Provisional application No. 62/819,054, filed on Mar. 15, 2019.

(51) Int. Cl.
*H03H 7/30* (2006.01)
*H03H 7/40* (2006.01)
(Continued)

(52) U.S. Cl.
CPC ......... *H04L 25/03165* (2013.01); *G06N 3/04* (2013.01); *G06N 3/08* (2013.01);
(Continued)

(58) Field of Classification Search
CPC . H04L 25/03165; H04L 27/2646; H04B 1/16; H04B 1/0028; H03F 3/20;
(Continued)

(56) References Cited

U.S. PATENT DOCUMENTS 9,137,082 B1 * 9/2015 Ali .................. H04L 27/2646
9,787,351 B2 * 10/2017 Martineau ............... H04W 4/70
(Continued)

OTHER PUBLICATIONS

Zhu, Anding, and Thomas J. Brazil. "Behavioral modeling of RF power amplifiers based on pruned Volterra series." IEEE Microwave and Wireless components letters 14, No. 12 (2004): 563-565.
(Continued)

*Primary Examiner* — Phuong Phu
(74) *Attorney, Agent, or Firm* — Hoffberg & Associates; Steven M. Hoffberg

(57) ABSTRACT

The nonlinearity of power amplifiers (PAs) has been a severe constraint in performance of modern wireless transceivers. This problem is even more challenging for the fifth generation (5G) cellular system since 5G signals have extremely high peak to average power ratio. Nonlinear equalizers that exploit both deep neural networks (DNNs) and Volterra series models are provided to mitigate PA nonlinear distortions. The DNN equalizer architecture consists of multiple convolutional layers. The input features are designed according to the Volterra series model of nonlinear PAs. This enables the DNN equalizer to effectively mitigate nonlinear PA distortions while avoiding over-fitting under limited training data. The non-linear equalizers demonstrate superior performance over conventional nonlinear equalization approaches.

20 Claims, 11 Drawing Sheets

System block diagram with nonlinear power amplifier and deep neural network equalizer.

(51) Int. Cl.
| | |
|---|---|
| *H03K 5/159* | (2006.01) |
| *H04L 25/03* | (2006.01) |
| *H04B 1/16* | (2006.01) |
| *H03F 3/20* | (2006.01) |
| *G06N 3/04* | (2006.01) |
| *G06N 3/08* | (2006.01) |
| *H03F 1/32* | (2006.01) |

(52) U.S. Cl.
CPC ............... *H03F 1/32* (2013.01); *H03F 3/20* (2013.01); *H04B 1/16* (2013.01); *H03F 2200/451* (2013.01)

(58) Field of Classification Search
CPC ....... H03F 1/32; H03F 2200/451; G06N 3/04; G06N 3/08; A61B 5/02438; H04W 4/70
USPC ....... 375/229, 231, 232, 316, 329, 320, 262, 375/264
See application file for complete search history.

(56) References Cited

U.S. PATENT DOCUMENTS

2012/0086504 A1\* 4/2012 Tsukamoto .......... H04B 1/0028
327/551
2016/0317096 A1\* 11/2016 Adams ............... A61B 5/02438

OTHER PUBLICATIONS

Zhu, Anding, Jos C. Pedro, and Thomas J. Brazil. "Dynamic deviation reduction-based Volterra behavioral modeling of RF power amplifiers." IEEE Transactions on microwave theory and techniques 54, No. 12 (2006): 4323-4332.

Boyd, Stephen, Leon O. Chua, and Charles A. Desoer. "Analytical foundations of Volterra series." IMA Journal of Mathematical Control and Information 1, No. 3 (1984): 243-282.

\* cited by examiner

System block diagram with nonlinear power amplifier and deep neural network equalizer.

Block diagram of DNN equalizer.

Constellation of 16QAM over a simulated PA received signal

16-QAM NLD equalization MSE results

EQ-MSE/SER improvement in percentage over measured NLD

|  | Volterra | | NN | | Volterra+NN | |
| --- | --- | --- | --- | --- | --- | --- |
|  | MSE | SER | MSE | SER | MSE | SER |
| 64-QAM | 16% | 26% | 10% | 25% | 42% | 44% |
| 16-QAM | 41% | 2% | 35% | 6% | 85% | 28% |
| QPSK | 57% | 0% | 100% | 0% | 100% | 0% |
| AVERAGE | 38% | 9% | 48% | 10% | 76% | 24% |

Fig. 6

INTEGRATING VOLTERRA SERIES MODEL AND DEEP NEURAL NETWORKS TO EQUALIZE NONLINEAR POWER AMPLIFIERS

CROSS REFERENCE TO RELATED APPLICATIONS

The present application claims benefit of priority under 35 U.S.C. § 119(e) from, and is a non-provisional of, U.S. Provisional Patent Application No. 62/819,054, filed Mar. 15, 2019, the entirety of which is expressly incorporated herein by reference.

FIELD OF THE INVENTION

The present invention relates to the field of equalization of nonlinear radio frequency power amplifiers, and more particularly to a neural network implementation of radio frequency power amplifier equalization

BACKGROUND OF THE INVENTION

Most modern wireless communication systems, including the fifth generation (5G) cellular systems, use multi-carrier or OFDM (orthogonal frequency division multiplexing) modulations whose signals have extremely high peak to average power ratio (PAPR). This makes it challenging to enhance the efficiency of power amplifiers (PAs). Signals with high PAPR need linear power amplifier response in order to reduce distortion. Nevertheless, PAs have the optimal power efficiency only in the nonlinear saturated response region. In practice, the PAs in the wireless transceivers have to work with high output backoff (OBO) in order to suppress nonlinear distortions, which unfortunately results in severe reduction of power efficiency [1]. This problem, originated from the nonlinearity of PAs, has been one of the major constraints to enhance the power efficiency of modern communication systems.

Various strategies have been investigated to mitigate this problem. The first strategy is to reduce the PAPR of the transmitted signals. Many techniques have been developed for this purpose, such as signal clipping, peak cancellation, error waveform subtraction [2]. For OFDM signals, pilot tones and unmodulated subcarriers can be exploited to reduce PAPR with some special pre-coding techniques [3].

The second strategy is to linearize the PAs at the transmitters. One of the dominating practices today is to insert a digital pre-distorter (DPD) before the PA, which distorts the signals appropriately so as to compensate for the nonlinear PA response [4] [5] [6]. DPD has been applied widely in many modern transmitters [2].

The third strategy is to mitigate the nonlinear PA distortions at the receivers via post-distorter equalization [7] [8] [9]. The solution presented in [10] develops a Bayesian signal detection algorithm based on the nonlinear response of the PAs. However, this method works for the simple "AM-AM AM-PM" nonlinear PA model only. Alternatively, as a powerful nonlinear modeling tool, artificial neural networks have also been studied for both nonlinear modeling of PAs [11] [12] and nonlinear equalization [13] [14] [15].

One of the major design goals for the 5G systems is to make the communication systems more power efficient. This needs efficient PAs, which is unfortunately more challenging since 5G signals have much higher PAPR and wider bandwidth [16] [17]. This is an especially severe problem for cost and battery limited devices in massive machine-type communications or internet of things (IoT). Existing nonlinear PA mitigation strategies may not be sufficient enough. PAPR can be reduced to some extent only. DPD is too complex and costly for small and low-cost 5G devices. Existing DPD and equalization techniques have moderate nonlinear distortion compensation capabilities only.

As a matter of fact, the nonlinear equalization strategy is more attractive to massive MIMO and millimeter wave transmissions due to the large number of PAs needed [18] [19] [20]. Millimeter wave transmissions require much higher transmission power to compensate for severe signal attenuation. Considering the extremely high requirement on PA power efficiency and the large number of PAs in a transmitter, the current practice of using DPD may not be appropriate due to implementation complexity and cost.

There are various types of intermodulation that can be found in radio systems, see, Rec. ITU-R SM.1446: Type 1 Single channel intermodulation: where the wanted signal is distorted by virtue of non-linearities in the transmitter; Type 2 Multichannel intermodulation: where the wanted signals of multi channels are distorted by virtue of non-linearities in the same transmitter; Type 3 Inter transmitter intermodulation: where one or more transmitters on a site intermodulate, either within the transmitters themselves or within a non-linear component on site to produce intermodulation products; Type 4 Intermodulation due to active antennas: the multicarrier operating mode of an active antenna, along with the non-linearity of amplifiers, originates spurious emissions under the form of intermodulation signals; and Type 5 Intermodulation due to passive circuits: where transmitters share the same radiating element and intermodulation occurs due to non-linearities of passive circuits. See, Rep. ITU-R-SM.2021

An amplifier can be characterized by a Taylor series of the generalized transfer function [Chadwick, 1986]

$$i_0 + k_1 e_{IN} + k_2 + e_{IN}^2 k_3 e_{IN}^3 + k_4 e_{IN}^4 + k_5 e_{IN}^5 +$$

where $i_0$ is the quiescent output current, k1, k2, etc. are coefficients and eIN represents the input signal. When two sinusoidal frequencies $\omega_1 = 2\pi f_1$ and $\omega_2 = 2\pi f_2$ of the amplitude $a_1$ and $a_2$ are applied to the input of the amplifier, the input signal is:

$$e_{IN} = a_1 \cos \omega_1 t + a_2 \cos \omega_2 t$$

and the output $i_{OUT}$ may be shown to be the sum of the DC components:

$$i_{OUT} = i_0 + \frac{k_2}{2}(a_1^2 + a_2^2) + \frac{k_4}{8}(3a_1^4 + 12a_1^2 + 3a_2^4)$$

fundamental components:

$$+(k_1 a_1 + \tfrac{3}{4} k_3 a_1^3 + \tfrac{3}{2} k_3 a_1 a_2^2 + \tfrac{5}{8} k_5 a_1^5 + \tfrac{15}{4} k_5 a_1^3 a_2^2 + \tfrac{15}{8} k_5 a_{12}^4)\cos \omega_1 t$$

$$+(k_1 a_2 + \tfrac{3}{4} k_3 a_2^3 + \tfrac{3}{2} k_3 a_1^2 a_2 + \tfrac{5}{8} k_5 a_2^5 + \tfrac{15}{4} k_5 a_1^2 a_2^3 + \tfrac{15}{8} k_5 a_1^4 a_2)\cos \omega_2 t$$

2nd order components:

$$+(\tfrac{1}{2} k_2 a_1^2 + \tfrac{1}{2} k_3 a_1^4 + \tfrac{3}{2} k_4 a_1^2 a_2^2)\cos 2\omega_1 t$$

$$+(\tfrac{1}{2} k_2 a_2^2 + \tfrac{1}{2} k_3 a_1^4 + \tfrac{3}{2} k_4 a_1^2 a_2^2)\cos 2\omega_2 t$$

$$+(k_2 a_1 a_2 + \tfrac{3}{2} k_4 a_1^3 a_2 + \tfrac{3}{2} k_4 a_1 a_2^3)\cos(\omega_1 \pm \omega_2) t$$

3rd order components:

$$+(\tfrac{1}{4}k_3 a_1^3 + \tfrac{5}{16}k_5 a_1^5 + \tfrac{5}{4}k_5 a_1^3 a_2^2)\cos 3\omega_1 t$$

$$+(\tfrac{1}{4}k_3 a_2^3 + \tfrac{5}{16}k_5 a_2^5 + \tfrac{5}{4}k_5 a_1^2 a_2^3)\cos 3\omega_2 t$$

$$+(\tfrac{3}{4}k_3 a_1^2 a_2 + \tfrac{5}{4}k_5 a_1^4 a_2 + \tfrac{15}{8}k_5 a_1^2 a_2^3)\cos(\omega_1 \pm 2\omega_2)t$$

$$+(\tfrac{3}{4}k_3 a_1 a_2^2 + \tfrac{5}{4}k_5 a_1 a_2^4 + \tfrac{15}{8}k_5 a_1^3 a_2^2)\cos(\omega_2 \pm 2\omega_1)t$$

4th order components:

$$+\tfrac{1}{8}k_4 a_1^4 \cos 4\omega_1 t + \tfrac{1}{8}k_4 a_2^4 \cos 4\omega_2 t$$

$$+\tfrac{1}{2}k_4 a_1^3 a_2 \cos(3\omega_1 \pm \omega_2)t + \tfrac{3}{4}k_4 a_1^2 a_2^2 \cos(2\omega_1 \pm 2\omega_2)t + \tfrac{1}{2}k_4 a_1 a_2^3 \cos(\omega_1 \pm 3\omega_2)t$$

and 5th order components:

$$+\tfrac{1}{16}k_5 a_1^5 \cos 5\omega_1 t + \tfrac{1}{16}k_5 a_2^5 \cos 5\omega_2 t$$

$$+\tfrac{5}{16}k_5 a_1^4 a_2 \cos(4\Omega_1 \pm \omega_2)t + \tfrac{5}{8}k_5 a_1^3 a_2^2 \cos(3\omega_1 \pm 2\omega_2)t$$

$$+\tfrac{5}{8}k_5 a_1^2 a_2^3 \cos(2\omega_1 \pm 3\omega_2)t + \tfrac{5}{16}k_5 a_1 a_2^4 \cos(\omega_1 \pm 4\omega_2)t$$

The series may be expanded further for terms in IN etc. if desired. All the even order terms produce outputs at harmonics of the input signal and that the sum and difference products are well removed in frequency far from the input signal. The odd order products, however, produce signals near the input frequencies f1±2f2 and f2±2f1. Therefore, the odd order intermodulation products cannot be removed by filtering, only by improvement in linearity.

Assuming class A operation, $a_1=a_2$ and $k_4$, $k_5$ are very small, the 3rd order intermodulation product IM3 becomes proportional to $a_3$. That means that the cube of the input amplitude and the graph of the intermodulation products will have a slope of 3 in logarithmic scale while the wanted signal will have the slope of 1. Second order products IM2 can be similarly calculated, and the graph for these has a slope of two. The points where these graphs cross are called 3rd order intercept point IP3 and 2nd order intercept point IP2, respectively. IP3 is the point where the intermodulation product is equal to the fundamental signal. This is a purely theoretical consideration, but gives a very convenient method of comparing devices. For example, a device with intermodulation products of −40 dBm at 0 dBm input power is to be compared with one having intermodulation products of −70 dBm for −10 dBm input. By reference to the intercept point, it can be seen that the two devices are equal.

The classical description of intermodulation of analogue radio systems deals with a two-frequency input model to a memoryless non-linear device. This non-linear characteristic can bedescribed by a function f(x), which yields the input-output relation of the element device. The function, f is usually expanded in a Taylor-series and thus produces the harmonics and as well the linear combinations of the input frequencies. This classical model is well suited to analogue modulation schemes with dedicated frequency lines at the carrier frequencies. The system performance of analogue systems is usually measured in terms of signal-to-noise (S//V) ratio, and the distorting intermodulation signal can adequately be described by a reduction of S/N.

With digital modulation methods, the situation is changed completely. Most digital modulation schemes have a continuous signal spectrum without preferred lines at the carrier frequencies. The system degradation due to intermodulation is measured in terms of bit error ratio (BER) and depends on a variety of system parameters, e.g. the special modulation scheme which is employed. For estimation of the system performance in terms of BER a rigorous analysis of non-linear systems is required. There are two classical methods for the analysis and synthesis of non-linear systems: the first one carries out the expansion of the signal in a Volterra series [Schetzen, 1980]. The second due to Wiener uses special base functionals for the expansion.

Both methods lead to a description of the non-linear system by higher order transfer functions having n input variables depending on the order of the non-linearity. Two data signals $x_1(t)$ and $x_2(t)$, originated from x(t), are linearly filtered by the devices with the impulse responses $h_a(t)$ and $h_b(t)$ in adjacent frequency bands. The composite summed signal y is hereafter distorted by an imperfect square-law device which might model a transmit-amplifier. The input-output relation of the non-linear device is given by: $z(t)=y(t)+ay^2(t)$ The output signal z(t) including the intermodulation noise is caused by non-linearities of third order. For this reason, the imperfect square-law device is now replaced by an imperfect cubic device with the input-output relation: $z(t)=y(t)+ay^3(t)$ There are several contributions of the intermodulation noise falling into the used channels near $f_0$.

Linearization of a transmitter system may be accomplished by a number of methods:

Feedforward linearization: This technique compares the amplified signal with an appropriately delayed version of the input signal and derives a difference signal, representing the amplifier distortions. This difference signal is in turn amplified, and subtracted from the final HPA output. The main drawback of the method is the requirement for a 2nd amplifier—the technique can, however, deliver an increase in output power of some 3 dB when used with a TWT.

Feedback linearization: In audio amplifiers, linearization may readily be achieved by the use of feedback, but this is less straightforward at high RF frequencies due to limitations in the available open-loop amplifier gain. It is possible, however, to feedback a demodulated form of the output, to generate adaptive pre-distortion in the modulator. It is clearly not possible to apply such an approach in a bent-pipe transponder, however, where the modulator and HPA are rather widely separated.

Predistortion: Rather than using a method that responds to the actual instantaneous characteristics of the HPA, it is common to pre-distort the input signal to the amplifier, based on a priori knowledge of the transfer function. Such pre-distortion may be implemented at RF, IF or at baseband. Baseband linearizers, often based on the use of look-up tables held in firmware memory are becoming more common with the ready availability of VLSI techniques, and can offer a compact solution. Until recently, however, it has been easier to generate the appropriate pre-distortion function with RF or IF circuitry.

RF amplifier linearization techniques can be broadly divided into two main categories:

Open-loop techniques, which have the advantage of being unconditionally stable, but have the drawback of being unable to compensate for changes in the amplifier characteristics.

Closed-loop techniques, which are inherently self-adapting to changes in the amplifier, but can suffer from stability problems.

Predistortion involves placing a compensating non-linearity into the signal path, ahead of the amplifier to be linearized. The signal is thus predistorted before being applied to the amplifier. If the predistorter has a non-linearity which is the exact inverse of the amplifier non-linearity, then the distortion introduced by the amplifier will exactly cancel the predistortion, leaving a distortionless output. In its simplest analogue implementation, a practical predistorter can be a network of resistors and non-linear elements such as diodes or transistors. Although adaptive predistortion schemes have been reported, where the non-linearity is implemented in digital signal processing (DSP), they tend to be very computationally or memory intensive, and power hungry.

Feedforward [Black, 1928] is a distortion cancellation technique for power amplifiers. The error signal generated in the power amplifier is obtained by summing the loosely coupled signal and a delayed inverted input signal, so that the input signal component is cancelled. This circuit is called the signal cancelling loop. The error signal is amplified by an auxiliary amplifier, and is then subtracted from the delayed output signal of the power amplifier, so that the distortion at the output is cancelled. This circuit is called the error cancelling loop. It is necessary to attenuate the input signal component lower than the error signal at the input of the auxiliary amplifier, so that the residual main signal does not cause overloading of the auxiliary amplifier, or does not cancel the main signal itself at the equipment output.

Negative feedback [Black, 1937] is a well-known linearization technique and is widely used in low frequency amplifiers, where stability of the feedback loop is easy to maintain. With multi-stage RF amplifiers however, it is usually only possible to apply a few dB of overall feedback before stability problems become intractable [Mitchell, 1979]. This is mainly due to the fact that, whereas at low frequency it can be ensured that the open-loop amplifier has a dominant pole in its frequency response (guaranteeing stability), this is not feasible with RF amplifiers because their individual stages generally have similar bandwidths. Of course, local feedback applied to a single RF stage is often used, but since the distortion reduction is equal to the gain reduction, the improvement obtained is necessarily small because there is rarely a large excess of open loop gain available.

At a given center frequency, a signal may be completely defined by its amplitude and phase modulation. Modulation feedback exploits this fact by applying negative feedback to the modulation of the signal, rather than to the signal itself. Since the modulation can be represented by baseband signals, we can successfully apply very large amounts of feedback to these signals without the stability problems that beset direct RF feedback. Early applications of modulation feedback used amplitude (or envelope) feedback only, applied to valve amplifiers [Arthanayake and Wood, 1971], where amplitude distortion is the dominant form of non-linearity. With solid-state amplifiers however, phase distortion is highly significant and must be corrected in addition to the amplitude errors.

For estimation of the system performance in terms of BER a rigorous analysis of non-linear systems is required. There are two classical methods for the analysis and synthesis of non-linear systems: the first one carries out the expansion of the signal in a Volterra series [Schetzen, 1980]. The second due to Wiener uses special base functionals for the expansion. These are the Wiener G -functionals which are orthogonal if white Gaussian noise excites the system. It is the special autocorrelation property of the white Gaussian noise which makes it so attractive for the analysis of non-linear systems. The filtered version of AWGN, the Brownian movement or the Wiener process, has special features of its autocorrelation which are governed by the rules for mean values of the products of jointly normal random variables.

The non-linear system output signal y(t) can be expressed by a Volterra series:

$$y(t) = H_0 + H_1 + H_2 +$$

where Hi is the abbreviated notation of the Volterra operator operating on the input x(t) of the system. The first three operators are given in the following. The convolution integrals are integrated from $-\infty$, to $+\infty$.

$$H_0[x(t)] = h_0$$

$$H_1[x(t)] = \int h_1(\tau) x(t-\tau) d\tau$$

$$H_2[x(t)] = \iint h_2(\tau_1, \tau_2) x(t-\tau_1) x(t-\tau_2) d\tau_1 d\tau_2$$

The kernels of the integral operator can be measured by a variation of the excitation time of input pulses, e.g. for the second order kernel $h_2(\tau_1, \tau_2)$: $x(t) = \delta(t-\tau_1)\delta(t-\tau_2)$. A better method is the measurement of the kernel by the cross-correlation of exciting white Gaussian noise n(t) as input signal with the system output $y_i(t)$. These equations hold, if:

$$\Phi_{nn}(\tau) = A\delta(\tau)$$

is the autocorrelation function of the input signal $x(t) = n(t)$ (white Gaussian noise) where A is the noise power spectral density. The first three kernels are given then by:

$$h_0 = \overline{y_0(t)}$$

$$h_1(\sigma) = \frac{1}{A} \overline{y_1(t) n(t-\sigma)}$$

$$h_2(\sigma_1, \sigma_2) = \frac{1}{2A^2} \overline{y_2(t) n(t-\sigma_1) n(t-\sigma_2)}$$

The overline denotes the expected value, or temporal mean value for ergodic systems.

The method can be expanded to higher order systems by using higher order Volterra operators $H_n$. However, the Volterra operators of different order are not orthogonal and, therefore, some difficulties arise at the expansion of an unknown system in a Volterra series.

These difficulties are circumvented by the Wiener G-functionals, which are orthogonal to all Volterra operators with lower order, if white Gaussian noise excites the system.

TABLE 1

| Volterra kernels | Direct Fourier Transform | Laplace transform |
|---|---|---|
| Linear (1$^{st}$ order) | $H_1 = \|H_1(\omega)\| = \left\| \int_{-\infty}^{+\infty} h_1(\tau_1) \cdot \exp(-j\omega\tau_1) \cdot d\tau_1 \right\|$ | $H_1(p) = k_1 \cdot L_1(p)$ |
| Quadratic (2$^{nd}$ order) | $H_2 = \|H_2(\omega)\| = \left\| \int_{-\infty}^{+\infty} \int_{-\infty}^{+\infty} h_2(\tau_1, \tau_2) \cdot \exp[-j\omega(\tau_1 + \tau_2)] \cdot d\tau_1 d\tau_2 \right\|$ | $H_2(p) = k_2 \cdot L_1(2p)$ |

TABLE 1-continued

| Volterra kernels | Direct Fourier Transform | Laplace transform |
|---|---|---|
| Cubic (3$^{rd}$ order) | $H_3 = \|H_3(\omega)\| = \left\| \int_{-\infty}^{+\infty} \int_{-\infty}^{+\infty} \int_{-\infty}^{+\infty} h_3(\tau_1, \tau_2, \tau_3) \cdot \exp[-j\omega(\tau_1 + \tau_2 + \tau_3)] \cdot d\tau_1 d\tau_2 d\tau_3 \right\|$ | $H_3(p) = k_3 \cdot L_1(3p)$ |

See, Panagiev, Oleg. "Adaptive compensation of the nonlinear distortions in optical transmitters using predistortion." Radioengineering 17, no. 4 (2008): 55.

The first three Wiener G-functionals are:

$$G_0[x(t)] = k_0$$

$$G_1[x(t)] = \int k_1(\tau_1) x(t-\tau_1) d\tau_1$$

$$G_2[x(t)] = \iint k_2(\tau_1, \tau_2) x(t-\tau_1) x(t-\tau_2) d\tau_1 d\tau_2 - A \int k_2(\tau_1, \tau_1) d\tau_1$$

$$G_3[x(t)] = \iiint k_3(\tau_1, \tau_2, \tau_3) x(t-\tau_1) x(t-\tau_2) x(t-\tau_3) d\tau_1 d\tau_2 d\tau_3 - 3A \iint k_3(\tau_1, \tau_2, \tau_2) x(t-\tau_1) d\tau_1 d\tau_2$$

For these functionals hold:

$$\overline{H_m[n(t)]G_n[n(t)]} = 0 \text{ for } m < n$$

if the input signal n(t) is white Gaussian noise.

The two data signals $x_1(t)$ and $x_2(t)$, from a single signal x(t), are linearly filtered by the devices with the impulse responses $h_a(t)$ and $h_b(t)$ in adjacent frequency bands. The composite summed signal y is hereafter distorted by an imperfect square-law device which might model a transmit-amplifier. The input-output relation of the non-linear device is given by:

$$z(t) = y(t) + a y^2(t)$$

The output signal z(t) is therefore determined by:

$$z(t) = \int [h_a(\tau) + h_b(\tau)] x(t-\tau) d\tau + a \left\{ \int [h_a(\tau) + h_b(\tau)] x(t-\tau) d\tau \right\}^2$$

The first and second order Volterra-operators $H_1$ and $H_2$ for this example are accordingly determined by the kernels:

$$h_1(\tau) = h_a(\tau) + h_b(\tau)$$

and $$h_2(\tau_1, \tau_2) = h_a(\tau_1)[h_a(\tau_2) + h_b(\tau_2)] + h_b(\tau_1)[h_a(\tau_2) + h_b(\tau_2)]$$

This kernel $h_2(\tau_1, \tau_2)$ is symmetric, so that:

$$h_2(\tau_1, \tau_2) = h_2(\tau_2, \tau_1)$$

The second order kernel transform $H_2(\omega_1, \omega_2)$ is obtained by the two-dimensional Fourier-transform with respect to $\tau_1$ and $\tau_2$, and can be obtained as:

$$H_2(\omega_1, \omega_2) = \{H_a(\omega_1)[H_a(\omega_2) + H_b(\omega_2)] + H_b(\omega_1)[H_a(\omega_2) + H_b(\omega_2)]\}$$

by elementary manipulations. $H_a(\omega)$ and $H_b(\omega)$ are the Fourier-transforms of $h_a(t)$ and $h_b(t)$. With the transform $X(\omega)$ of the input signal x(t), an artificial two dimensional transform $Z_2(\omega_1, \omega_2)$ is obtained:

$$Z_{(2)}(\omega_1, \omega_2) = H_2(\omega_1, \omega_2) X(\omega_1) X(\omega_2)$$

with the two-dimensional inverse $Z_2(t_1, t_2)$. The output signal z(t) is:

$$z(t) = z_{(2)}(t, t)$$

The transform $Z(\omega)$ of z(t) can be obtained by convolution:

$$Z(\omega) = \frac{1}{2\pi} \int Z_{(2)}(\omega_1, \omega - \omega_1) d\omega_1$$

where the integration is carried out from $-\infty$ to $+\infty$.

The output z(t) can be as well represented by use of the Wiener G-functionals:

$$z(t) = G_0 + G_1 + G_2 +$$

where $G_i$ is the simplified notation of $G_i[x(t)]$. The first two operators are:

$$G_0[x(t)] = -A \int [h_a(\tau) + h_b(\tau)]^2 d\tau = \text{const}$$

$$G_1[x(t)] = \int [h_a(\tau) + h_b(\tau)] x(t-\tau) d\tau$$

The operator $G_i$ equals $H_i$ in this example. For x(t) equal white Gaussian noise $x(t) = n(t)$ $\overline{G_1[n(t)] h_0} = 0$ holds for all $h_0$, especially:

$$\overline{G_1 G_0} = 0.$$

$$G_2[x(t)] = \int [h_a(\tau_1) h_a(\tau_2) + h_a(\tau_1) h_b(\tau_2) + h_b(\tau_1) h_a(\tau_2) + h_b(\tau_1) h_b(\tau_2)]$$

$$x(t-\tau_1) x(t-\tau_2) d\tau_1 d\tau_2 - A \int [h_a(\tau_1) h_b(\tau_1)]^2 d\tau_1$$

The consequence is:

$$\overline{G_2 h_0} = h_0 \int [h_a(\tau_1) h_a(\tau_2) + h_a(\tau_1) h_b(\tau_2) + h_b(\tau_1) h_a(\tau_2) + h_b(\tau_1) h_b(\tau_2)]$$

$$\overline{n(t-\tau_1) n(t-\tau_2)} d\tau_1 d\tau_2 - h_0 A \int [h_a(\tau_1) + h_b(\tau_1)]^2 d\tau_1$$

and $$\overline{G_2 h_0} = 0 \text{ because of } \overline{n(t-\tau_1) n(t-\tau_2)} = A\delta(\tau t_1 - \tau_2)$$

and similarly:

$$\overline{G_2 H_1} = 0 \text{ for all } H_1$$

This equation involves the mean of the product of three zero mean jointly Gaussian random variables, which is zero.

The Wiener kernels can be determined by exciting the system with white Gaussian noise and taking the average of some products of the system output and the exciting noise process n(t):

$$k_0 = \overline{z(t)}$$

$$k_1(\tau) = \frac{1}{A} \overline{z(t) \, n(t-\tau)}$$

$$k_2(\tau_1, \tau_2) = \frac{1}{2A^2} \overline{z(t) \, n(t-\tau_1) \, n(t-\tau_2)}$$

For RF-modulated signals the intermodulation distortion in the proper frequency band is caused by non-linearities of third order. For this reason, the imperfect square-law device is now replaced by an imperfect cubic device with the input-output relation:

$$z(t) = y(t) + a y^3(t)$$

If only the intermodulation term which distorts the signal in its own frequency band is considered, the kernel transform of the third-order Volterra operator $Z_{(3)}(\omega_1, \omega_2, \omega_3)$ becomes then:

$$Z_{(3)}(\omega_1, \omega_2, \omega_3) = a \prod_{i=1}^{3} [H_a(\omega_i) + H_b(\omega_i)] X(\omega_i)$$

The intermodulation part in the spectrum of z(t) is now given by:

$$Z(\omega) = \frac{1}{(2\pi)^2} \int \int Z_{(3)}(\omega - \mu_1, \mu_1 - \mu_2, \mu_2) d\mu_1 \, d\mu_2$$

For a cubic device replacing the squarer, however, there are several contributions of the intermodulation noise falling into the used channels near $f_0$.

See, Amplifier References, infra.

The Volterra series is a general technique, and subject to different expressions of analysis, application, and simplifying presumptions. Below is further discussion of the technique.

A system may have hidden states of input-state-output models. The state and output equations of any analytic dynamical system are $$\dot{x}(t) = f(x, u, \theta)$$

$$y(t) = g(x, u, \theta) + \varepsilon$$

$\dot{x}(t)$ is an ordinary differential equation and expresses the rate of change of the states as a parameterised function of the states and input. Typically, the inputs u(t) correspond to designed experimental effects. There is a fundamental and causal relationship (Fliess et al 1983) between the outputs and the history of the inputs. This relationship conforms to a Volterra series, which expresses the output y(t) as a generalized convolution of the input u(t), critically without reference to the hidden states $\dot{x}(t)$. This series is simply a functional Taylor expansion of the outputs with respect to the inputs (Bendat 1990). The reason it is a functional expansion is that the inputs are a function of time.

$$y(t) = \sum_i \int_0^t \cdots \int_0^t \kappa_i(\sigma_1, \ldots, \sigma_i) u(t - \sigma_1), \ldots,$$

$$u(t - \sigma_i) d\sigma_1, \ldots, d\sigma_i$$

$$\kappa_i(\sigma_1, \ldots, \sigma_i) = \frac{\partial^i y(t)}{\partial u(t - \sigma_1), \ldots, \partial u(t - \sigma_i)}$$

were $\kappa_i(\sigma_1, \ldots, \sigma_i)$ is the ith order kernel, and the integrals are restricted to the past (i.e., integrals starting at zero), rendering the equation causal. This equation is simply a convolution and can be expressed as a GLM. This means that we can take a realistic model of responses and use it as an observation model to estimate parameters using observed data. Here the model is parameterized in terms of kernels that have a direct analytic relation to the original parameters θ of the physical system. The first-order kernel is simply the conventional HRF. High-order kernels correspond to high-order HRFs and can be estimated using basis functions as described above. In fact, by choosing basis function according to $$A(\sigma)_i = \frac{\partial \kappa(\sigma)_1}{\partial \theta_i}$$

one can estimate the physical parameters because, to a first order approximation, $\beta_i = \theta_i$. The critical step is to start with a causal dynamic model of how responses are generated and construct a general linear observation model that allows estimation and inference about the parameters of that model. This is in contrast to the conventional use of the GLM with design matrices that are not informed by a forward model of how data are caused.

Dynamic causal models assume the responses are driven by designed changes in inputs. An important conceptual aspect of dynamic causal models pertains to how the experimental inputs enter the model and cause responses. Experimental variables can illicit responses in one of two ways. First, they can elicit responses through direct influences on elements. The second class of input exerts its effect through a modulation of the coupling among elements. These sorts of experimental variables would normally be more enduring. These distinctions are seen most clearly in relation to particular forms of causal models used for estimation, for example the bilinear approximation $$x(t) = f(x, u)$$
$$= Ax + uBx + Cu$$
$$y = g(x) + \varepsilon$$
$$A = \frac{\partial f}{\partial x} \quad B = \frac{\partial^2 f}{\partial x \partial u} \quad C = \frac{\partial f}{\partial u}$$

This is an approximation to any model of how changes in one element $x(t)_i$ are caused by activity of other elements. Here the output function g(x) embodies a model. The matrix A represents the connectivity among the regions in the absence of input u(t). Effective connectivity is the influence that one system exerts over another in terms of inducing a response $\partial \dot{x}/\partial x$. This latent connectivity can be thought of as the intrinsic coupling in the absence of experimental perturbations. The matrix B is effectively the change in latent coupling induced by the input. It encodes the input-sensitive changes in A or, equivalently, the modulation of effective connectivity by experimental manipulations. Because B is a second-order derivative it is referred to as bilinear. Finally, the matrix C embodies the extrinsic influences of inputs on activity. The parameters θ={A, B, C} are the connectivity or coupling matrices that we wish to identify and define the functional architecture and interactions among elements. We can express this as a GLM and estimate the parameters using EM in the usual way (see Friston et al 2003). Generally, estimation in the context of highly parameterized models like DCMs requires constraints in the form of priors. These priors enable conditional inference about the connectivity estimates.

The central idea, behind dynamic causal modelling (DCM), is to model a physical system as a deterministic nonlinear dynamic system that is subject to inputs and produces outputs. Effective connectivity is parameterized in terms of coupling among unobserved states. The objective is to estimate these parameters by perturbing the system and measuring the response. In these models, there is no designed perturbation and the inputs are treated as unknown and stochastic. Furthermore, the inputs are often assumed to express themselves instantaneously such that, at the point of observation the change in states will be zero. In the absence of bilinear effects we have $$\dot{x}=0$$

$$=Ax+Cu$$

$$x=-A^{-1}Cu$$

This is the regression equation used in SEM where $A=A'-I$ and $A'$ contains the off-diagonal connections among regions. The key point here is that A is estimated by assuming u is some random innovation with known covariance. This is not really tenable for designed experiments when u represent carefully structured experimental inputs. Although SEM and related autoregressive techniques are useful for establishing dependence among responses, they are not surrogates for informed causal models based on the underlying dynamics of these responses.

The Fourier transform pair relates the spectral and temporal domains. We use the same symbol F, although $F(t)$ and $F(\omega)$ are different functions:

$$F(t) = \frac{1}{2\pi}\int_{-\infty}^{\infty} d\omega F(\omega)e^{-i\omega t}, F(\omega) = \int_{-\infty}^{\infty} dt F(t)e^{i\omega x}$$

Accordingly, a convolution integral is derived:

$$D(t) = \int_{-\infty}^{\infty} dt_1 \varepsilon(t_1)E(t-t_1)$$

where $D(t)$, $\varepsilon(t)$, $E(t)$, are related to $D(\omega)$, $\varepsilon(-i\omega)$, $E(\omega)$, respectively. Note that $D(t)$ can be viewed as an integral operation, acting on $E(t)$ is the simplest form of a Volterra Function Series (VFS). This can also be expressed in the VDO representation $$D(t)=\varepsilon(\partial_t)E(t)=\varepsilon(\partial_\tau)E(\tau)|_{\tau \Rightarrow t}$$

The instruction $\tau \Rightarrow t$ is superfluous in a linear case, but becomes important for non-linear systems. For example, consider a harmonic signal clarifying the role of the VDO:

$$E(t) = E_0 e^{-i\omega t}$$

$$D(t) = E_0 e^{-i\omega t}\int_{-\infty}^{\infty} dt_1 E(t_1)e^{i\omega t_1} = \varepsilon(-i\omega)E_0 e^{-i\omega t} = \varepsilon(\partial_t)E_0 e^{i\omega t}$$

In nonlinear systems, the material relations involve powers and products of fields, and $\dot{x}(t)$ can be replaced by a series involving powers of $E(\omega)$, but this leads to inconsistencies.

However, the convolution can be replaced by a "super convolution", the Volterra function series (VFS), which can be considered a Taylor expansion series with memory, given by:

$$D(t) = \sum_m D^{(m)}(t)$$

$$D^{(m)}(t) = \int_{-\infty}^{\infty} dt_1 \ldots \int_{-\infty}^{\infty} dt_m \varepsilon^{(m)}(t_1, \ldots, t_m)E(t-t_1)\cdots E(t-t_m)$$

Typically, the VFS contains the products of fields expected for nonlinear systems, combined with the convolution structure. Various orders of nonlinear interaction are indicated by m. Theoretically all the orders co-exist (in practice the series will have to be truncated within some approximation), and therefore we cannot readily inject a time harmonic signal. If instead a periodic signal, $$E(t) = \sum_n E_n e^{-in\omega t}$$

is provided, we find $$D^{(m)}(t) =$$

$$\sum_{n_1,\ldots,n_m} \varepsilon^{(m)}(-in_1\omega, \ldots, -in_m\omega)E_{n_1} \cdots E_{n_m} e^{-iN\omega t} = \sum_N D_N e^{-iN\omega t}$$

$$N = n_1 + \ldots + n_m$$

displaying the essential features of a nonlinear system, namely, the dependence on a product of amplitudes, and the creation of new frequencies as sums (including differences and harmonic multiples) of the interacting signals frequencies. This function contains the weighting function $\varepsilon^{(m)}(-in\omega, \ldots, -in_m\omega)$ for each interaction mode.

The extension to the nonlinear VDO is given by $$D^{(m)}(t)=\varepsilon^{(m)}(\partial_{t_1}, \ldots, \partial_{t_m})E(t_1)\ldots E(t_m)|_{t_1, \ldots, t_m \Rightarrow t}$$

In which the instruction $t_1, \ldots, t_m \Rightarrow t$ guarantees the separation of the differential operators, and finally renders both sides of the equation to become functions of t.

The VFS, including the convolution integral, is a global expression describing $D(t)$ as affected by integration times extending from $-\infty$ to $\infty$. Physically this raises questions about causality, i.e., how can future times affect past events. In the full-fledged four-dimensional generalization causality is associated with the so called "light cone" (Bohm, 1965). It is noted that the VDO representation is local, with the various time variables just serving for book keeping of the operators, and where this representation is justified, causality problems are not invoked. In a power amplifier the physical correlate of this feature is that all past activity leads to a present state of the system, e.g., temperature, while the current inputs affect future states. In general, the frequency constraint is obtained from the Fourier transform of the VFS, having the form $$D^{(m)}(\omega) =$$

$$\frac{1}{(2\pi)^{m-1}}\int_{-\infty}^{\infty} d\omega_1 \ldots \int_{-\infty}^{\infty} d\omega_{m-1} \varepsilon^{(m)}(-i\omega_1, \ldots, -i\omega_m)E(\omega_1) \cdots E(\omega_m)$$

$$\omega = \omega_1 + \ldots + \omega_m$$

In which we have m−1 integrations, one less than in the VFS form. Consequently, the left and right sides of the Fourier transform are functions of $\omega$, $\omega_m$, respectively. The additional $\omega = \omega_1 + \ldots + \omega_m$ constraint completes the equation and renders it self-consistent.

See, Volterra Series References, infra.

An alternate analysis of the VFS is as follows. Let x[n] and y[n] represent the input and output signals, respectively, of a discrete-time and causal nonlinear system. The Volterra series expansion for y[n] using x[n] is given by:

$$y[n] = h_0 + \sum_{m_1=0}^{\infty} h_1[m_1]x[n-m_1] + \sum_{m_1=0}^{\infty}\sum_{m_2=0}^{\infty} h_2[m_1, m_2]x[n-m_1]x[n-m_2] + \ldots + \sum_{m_1=0}^{\infty}\sum_{m_2=0}^{\infty} \ldots \sum_{m_p=0}^{\infty} h_p[m_1, m_2, \ldots, m_p] x[n-m_1]x[n-m_2] \ldots x[n-m_p] + \ldots$$

$h_p[m_1, m_2, \ldots, m_p]$ is known as the p-the order Volterra kernel of the system. Without any loss of generality, one can assume that the Volterra kernels are symmetric, i.e., $h_p[m_1, m_2, \ldots, m_p]$ is left unchanged for any of the possible p! Permutations of the indices $m_1, m_2, \ldots, m_p$. One can think of the Volterra series expansion as a Taylor series expansion with memory. The limitations of the Volterra series expansion are similar to those of the Taylor series expansion, and both expansions do not do well when there are discontinuities in the system description. Volterra series expansion exists for systems involving such type of nonlinearity. Even though clearly not applicable in all situations, Volterra system models have been successfully employed in a wide variety of applications.

Among the early works on nonlinear system analysis is a very important contribution by Wiener. His analysis technique involved white Gaussian input signals and used "G-functionals" to characterize nonlinear system behavior. Following his work, several researchers employed Volterra series expansion and related representations for estimation and time-invariant or time variant nonlinear system identification. Since an infinite series expansion is not useful in filtering applications, one must work with truncated Volterra series expansions.

The discrete time impulse response of a first order (linear) system with memory span is aggregate of all the N most recent inputs and their nonlinear combinations into one expanded input vector as $X_e(n) = [x(n), x(n-1), \ldots, x(n-N+1), x^2(n) \\ x(n-1), \ldots, x^Q(n-N+1)]^T$ Similarly, the expanded filter coefficients vector H(n) is given by $H(n) = [h_1(0), h_1(1), \ldots, h_1(N-1), h_2(0,0), \\ h_2(0,1), \ldots, h_Q(N-1, \ldots, N-1)]^T$ The Volterra Filter input and output can be compactly rewritten as $y(n) = H^T(n)X_e(n)$ The error signal e(n) is formed by subtracting y(n) from the noisy desired response d(n), i.e., $e(n) = d(n) - y(n) = d(n) - H^T(n) \textrm{i } X_e(n)$ For the LMS algorithm, this may be minimized to $E[e^2(n)] = E[d(n) - H^T(n)X_e(n)]$ The LMS update equation for a first order filter is $H(n+1) = H(n) + \mu|e(n)|X_e(n)$ where $\mu$ is small positive constant (referred to as the step size) that determines the speed of convergence and also affects the final error of the filter output. The extension of the LMS algorithm to higher order (nonlinear) Volterra filters involves a few simple changes. Firstly, the vector of the impulse response coefficients becomes the vector of Volterra kernels coefficients. Also, the input vector, which for the linear case contained only a linear combination, for nonlinear time varying Volterra filters, complicates treatment.

The RLS (recursive least squares) algorithm is another algorithm for determining the coefficients of an adaptive filter. In contrast to the LMS algorithm, the RLS algorithm uses information from all past input samples (and not only from the current tap-input samples) to estimate the (inverse of the) autocorrelation matrix of the input vector.

To decrease the influence of input samples from the far past, a weighting factor for the influence of each sample is used. The Volterra filter of a fixed order and a fixed memory adapts to the unknown nonlinear system using one of the various adaptive algorithms. The use of adaptive techniques for Volterra kernel estimation has been well studied. Most of the previous research considers 2nd order Volterra filters and some consider the 3rd order case.

A simple and commonly used algorithm is based on the LMS adaptation criterion. Adaptive Volterra filters based on the LMS adaptation algorithm are computational simple but suffer from slow and input signal dependent convergence behavior and hence are not useful in many applications. As in the linear case, the adaptive nonlinear system minimizes the following cost function at each time:

$$J[n] = \sum_{k0}^{n} \lambda^{n-k}(d[k] - H^T[n]x[k])^2$$

where, H(n) and X(n) are the coefficients and the input signal vectors, respectively, $\lambda$ is a factor that controls the memory span of the adaptive filter and d(k) represents the desired output. The solution can be obtained by differentiating J[n] with respect to H[n], setting the derivative to zero, and solving for H[n]. The optimal solution at time n is given by $$H[n] = C^{-1}[n]P[n]$$

$$C[n] = \sum_{k=0}^{n} \lambda^{n-k} X[k]X^T[k]$$

$$P[n] = \sum_{k=0}^{n} \lambda^{n-k} d[k]X[k]$$

H[n] can be recursively updated by realizing that $C[n] = \lambda C[n-1] + X[n]X^T[n]$ and $P[n] = \lambda P[n-1] + d[n]X[n]$ The computational complexity may be simplified by making use of the matrix inversion lemma for inverting C[n]. The derivation is similar to that for the RLS linear adaptive filter.

$C^{-1}[n] = \lambda^{-1}C^{-1}[n-1] - \lambda^{-1}k[n]X^T[n]C^{-1}[n-1]$

There are a few simple models for basic amplifier non-linear behavior. A more rigorous model could include the Volterra series expansion which can model complex non-linearities such as memory effects. Among the simpler models are the Rapp model, Saleh model and the Ghorbani model. Combinations of pure polynomial models and filter models are also often referred to as fairly simple models, e.g., the Hammerstein model.

The advantage of the simpler models is usually in connection to for a need of very few parameters to model the non-linear behavior. The drawback is that such a model only can be used in conjunction with simple architecture amplifiers such as the basic Class A, AB and C amplifiers. Amplifiers such as the high efficiency Doherty amplifier can in general not be modelled by one of these simple models. In addition, to properly capture the PA behavior for the envisaged large NR bandwidths, it is essential to use PA models capturing the memory effects. Such models would require an extensive set of empirical measurements for proper parameterization.

The Rapp model has basically two parameters by which the general envelop distortion may be described. It mimics the general saturation behavior of an amplifier and lets the designer set a smoothness of the transition by a P-factor. By extending this also to model phase distortion, one has in total six parameters available. The basic simple model may be found as:

$$V_{out} = \frac{V_{in}}{\left(1 + \left(\frac{|V_{in}|}{V_{sat}}\right)^{2P}\right)^{\frac{1}{2P}}}$$

This model produces a smooth transition for the envelope characteristic as the input amplitude approaches saturation. In the more general model, both AM-AM and AM-PM distortion can be modelled. In general terms, the model describes the saturation behavior of a radio amplifier in a good way.

$$F_{AM-AM} = \frac{Gx}{\left(1 + \left|\frac{Gx}{V_{sat}}\right|^{2P}\right)^{\frac{1}{2P}}}$$

$$F_{AM-PM} = \frac{Ax^q}{1 + \left(\frac{x}{B}\right)^q}$$

where "x" is the envelope of the complex input signal. If signal measurements are at hand of the input/output relationship, the parameters of the model may be readily found for a particular amplifier by for example regression techniques. The strength of the Rapp model is lies in its simple and compact formulation, and that it gives an estimation of the saturation characteristics of an amplifier. The drawback of this simple model is of course that it cannot model higher order classes of amplifiers such as the Doherty amplifier. It also lacks the ability to model memory effects of an amplifier.

The Saleh model is a similar model to the Rapp model. It also gives an approximation to the AM-AM and AM-PM characteristics of an amplifier. It offers a slightly fewer number of parameters (4) that one can use to mimic the input/output relationship of the amplifier. The AM-AM distortion relation and AM-PM distortion relation are found to be as:

$$g(r)_{AM-AM} = \frac{\alpha_a r}{1 + \beta_a r^2}$$

$$f(r)_{AM-PM} = \frac{\alpha_\varphi r^2}{1 + \beta_\varphi r^2}$$

where "r" is the envelope of the complex signal fed into the amplifier, and $\alpha/\beta$ are real-valued parameters that can be used to tune the model to fit a particular amplifier.

The Ghorbani model also gives expressions similar to the Saleh model, where AM-AM and AM-PM distortion is modeled. Following Ghorbani, the expressions are symmetrically presented:

$$g(r) = \frac{x_1 r^{x_2}}{1 + x_3 r^{x_2}} + x_4 r$$

$$f(r) = \frac{y_1 r^{y_2}}{1 + y_3 r^{y_2}} + y_4 r$$

In the expressions above, g(r) corresponds to AM-AM distortion, while f(r) corresponds to AM-PM distortion. The actual scalars $x_{1-4}$ and $y_{1-4}$ have to be extracted from measurements by curve fitting or some sort of regression analysis.

The next step in the more complex description of the non-linear behavior of an amplifier is to view the characterization as being subject to a simple polynomial expansion. This model has the advantage that it is mathematically pleasing in that it for each coefficient reflects higher order of inter-modulations. Not only can it model third order intermodulation, but also fifth/seventh/ninth etc. Mathematically it can also model the even order intermodulation products as well, it merely is a matter of discussion whether these actually occur in a real RF application or not.

$$y(t) = a_0 + a_1 x(t) + a_2 x(t)^2 + a_3 x(t)^3 + a_4 x(t)^4$$

$$A_{IP3} = \sqrt{4a_1/3|a_3|}$$

Coefficients may be readily expressed in terms of Third Order Intercept point IP3 and gain, as described above. This feature makes this model especially suitable in low level signal simulations, since it relates to quantities that usually are readily available and easily understood amongst RF engineers.

The Hammerstein model consists of a combination of a Linear+Non-Linear block that is capable of mimicking a limited set of a Volterra Series. As the general Volterra series models a nested series of memory and polynomial representations, the Hammerstein model separates these two defining blocks that can in theory be separately be identified with limited effort. The linear part is often modelled as a linear filter in the form of a FIR-filter.

$$s(n) = \sum_{k=0}^{K-1} h(k)x(n-k)$$

The non-linear part is then on the other hand simply modelled as polynomial in the enveloped domain.

$$y(t) = a_0 + a_1 x(t) + a_2 x(t)^2 + a_3 x(t)^3 + a_4 x(t)^4$$

The advantage of using a Hammerstein model in favor of the simpler models like Rapp/Saleh or Ghorbani is that it can in a fairly simple way also model memory effects to a certain degree. Although, the model does not benefit from a clear relationship to for example IIP3/Gain but one has to employ some sort of regression technique to derive polynomial coefficients and FIR filter tap coefficients.

The Wiener model describes like the Hammerstein model a combination of Non-linear+Linear parts that are cascaded after each other. The difference to the Hammerstein model lies in the reverse order of non-linear to linear blocks. The initial non-linear block is preferably modelled as a polynomial in the envelope of the complex input signal. This block is the last one in the Hammerstein model as described above. The polynomial coefficients may themselves be complex, depending on what fits measured data best. See expressions for non-linear and linear parts under the Hammerstein section. The second block which is linear may be modelled as an FIR filter with a number of taps that describes the memory depth of the amplifier.

The state-of-the-art approaches consider the so called Volterra series, and is able to model all weak non-linearity with fading memory. Common models like, for example, the memory polynomial can also be seen as a subset of the full Volterra series and can be very flexible in designing the model by simply adding or subtracting kernels from the full series.

The discrete-time Volterra series, limited to causal systems with symmetrical kernels (which is most commonly used for power amplifier modelling) is written as $$y[n] = \beta_0 + \sum_{p=1}^{P} \sum_{\tau_1=0}^{M} \sum_{\tau_2=\tau_1}^{M} \cdots \sum_{\tau_p=\tau_{p-1}}^{M} \beta_{p,\tau_1,\tau_2,\ldots,\tau_p} \prod_{j_1=1}^{p} x\left[n - \tau_{j_1}\right] \prod_{j_2=p+1}^{2p-1} \bar{x}[n - \tau_{j_2}]$$

in which P is the non-linear order and M is the memory-depth. There are benefits which the Volterra series hold over other modelling approaches, including:

It is linear in parameters, meaning that the optimal parameters may be found through simple linear regression analysis from measured data. It further captures frequency dependencies through the inclusion of memory effects which is a necessity for wideband communication.

The set of kernels, or basis functions, best suited for modelling a particular power amplifier may be selected using methods which rely on physical insight. This makes the model scalable for any device technology and amplifier operation class.

It can be extended into a multivariate series expansion in order to include the effects of mutual coupling through antenna arrays. This enables the studies on more advanced algorithms for distortion mitigation and precoding.

It may be observed that other models such as static polynomials, memory polynomials and combinations of the Wiener and Hammerstein models are all subsets of the full Volterra description. As previously stated, empirical measurements are needed to parameterized PA model based on Volterra series expansion.

A subset of the Volterra Series is the memory polynomial with polynomial representations in several delay levels. This is a simpler form of the general Volterra series. The advantage of this amplifier model is its simple form still taking account of memory effects. The disadvantage is that the parameters have to be empirically solved for the specific amplifier in use.

$$PA_{memory} = x(t) \cdot [a_0 + a_1 \cdot |x(t)| + a_2 \cdot |x(t)|^2 + \ldots] +$$

$$+ x(t-t_0) \cdot [b_0 + b_1 \cdot |x(t-t_0)| + b_2 \cdot |x(t-t_0)|^2 + \ldots] +$$

$$+ x(t-t_1) \cdot [c_0 + c_1 \cdot |x(t-t_1)| + c_2 \cdot |x(t-t_1)|^2 + \ldots] +$$

The equation above shows an expression for a memory polynomial representation of an amplifier involving two memory depth layers. Each delayed version of the signal is associated with its own polynomial expressing the non-linear behavior.

See Filter References, Infra.

The purpose of a PA behavioral model is to describe the input-to-output relationship as accurately as possible. State-of-the-art approaches lean on a fundament of the so called Volterra series consisting of a sum of multidimensional convolutions. Volterra series are able to model all weak nonlinearities with fading memory and thus are feasible to model conventional PAs aimed for linear modulation schemes.

The GMP model is given by $$y_{GMP}(n) = \sum_{k \in K_a} \sum_{l \in L_a} a_{kl} x(n-l) |x(n-l)|^{2k} + \sum_{k \in K_b} \sum_{l \in L_b} \sum_{m \in M} b_{klm} x(n-l) |x(n-l-m)|^{2k}$$

where $y_{GMP}$ (n) and x(n) represent the complex baseband equivalent output and input, respectively, of the model. The first term represents the double sum of so-called diagonal terms where the input signal at time shift l, x(n −l); l∈$L_a$, is multiplied by different orders of the time aligned input signal envelope |x(n−l)|$^{2k}$; k∈$K_a$. The triple sum represents cross terms, i.e. the input signal at each time shifts is multiplied by different orders of the input signal envelope at different time shifts. The GMP is linear in the coefficients, $a_{kl}$ and $b_{klm}$, which provides robust estimation based on input and output signal waveforms of the PAs to be characterized. As a complement to the above, also memoryless polynomial models have been derived based on:

$$y_P(n) = \sum_{k \in K_P} a_k x(n) |x(n)|^{2k}$$

It is thus seen that, while the Volterra series has been considered generally in a variety of contexts, and for power amplifier linearization, the particular implementation does not necessarily follow from broad prescriptions.

See, Volterra Series Patents, infra.

SUMMARY OF THE INVENTION

A deep neural network (DNN)-based equalizer is provided to equalize the PA distorted signals at a radio frequency receiver. This DNN equalizer exploits both the Volterra series nonlinearity modeling of PAs, to construct the input features of the DNN, which can help the DNN converge rapidly to the desired nonlinear response under limited training data and training.

Conventionally, Volterra series and neural networks are studied as two separate techniques for nonlinear PAs [2]. Volterra series has been a popular choice for constructing the models of nonlinear power amplifiers. Many digital predistorters or nonlinear equalizers have been developed based on such modeling. Similarly, artificial neural networks have also been applied to model or equalizer the nonlinear PAs. By integrating these two techniques together, equalizers may be more efficient and have low-cost implementation than conventional digital pre-distorters, and have high performance in mitigating power amplifier with even severe nonlinearity.

In particular, conventional shallow feedforward neural networks using time-delayed inputs have only limited performance. The present DNN equalizer has much superior performance and does not need too much training data.

Nonlinear Power Amplifier Models

The nonlinear response of the power amplifiers are usually described by the baseband discrete model y(n)=f(x(n)), where x(n) is the input signal and y(n) is the output signal. The function f(x(n)) is some nonlinear function.

Consider the baseband discrete model of the PA y(n)=f(x(n), x(n-1), ... ), where x(n) is the input signal, y(n) is the output signal, and f(·) is some nonlinear function. The simplest nonlinear PA model is the "AM-AM AM-PM" model. Let the amplitude of the input signal be Vx=E[|x(n)|], where E[·] denotes short-term expectation or average. The output sample y(n)'s amplitude $V_y$=E[y(n)] and additional phase change $\psi_y$=E[/y(n)] depend on $V_x$ in nonlinear ways as $$V_y = \frac{gV_x}{\left(1 + \frac{gV_x}{c}\right)^{\frac{1}{2\sigma}}}, V_y = \frac{\alpha V_x^p}{\left(1 + \frac{V_x^q}{\beta}\right)} \quad (1)$$

where g is the linear gain, a the smoothness factor, and c denotes the saturation magnitude of the PA. Typical examples of these parameters are g=4:65, σ=0:81, c=0:58, α=2560, β=0:114, p=2:4, and q=2:3, which are used in the PA models regulated by IEEE 803.11ad task group (TG) [10].

More accurate models should take into consideration the fact that nonlinearity leads to memory effects. In this case, Volterra series are typically used to model PAs [4] [21]. A general model is [5]

$$y(n) = \sum_{d=0}^{D} \sum_{p=0}^{P} b_{kd} x(n-d)|x(n-d)|^{k-1} \quad (2)$$

with up to $P^{th}$ order nonlinearity and up to D step memory.

Because higher order nonlinearity usually has smaller magnitudes, in order to simplify models, many papers have considered smaller P only, e.g., $$y(n) = \sum_{d=0}^{D} (\beta_D x(n-d) + \alpha_d x(n-d)|x(n-d)|^2)$$

with only the third-order nonlinearity. It can be shown that only odd-order nonlinearity (i.e., odd k) is necessary as even-order nonlinearity disappears during spectrum analysis.

It can be shown that only odd-order nonlinearity (i.e., odd k) is necessary because even-order nonlinearity falls outside of the passband and will be filtered out by the receiver bandpass filters [2]. To illustrate this phenomenon, we can consider some simple examples where the input signal x(n) consists of a few single frequency components only. Omitting the memory effects, if x(n) is a single frequency signal, i.e., x(n)=$V_0$ cos($a_0$+φ), where $a_0$=2π$f_0$n. Then, the output signal can be written as $$y(n) = c_1 V_0 \cos(a_0+\phi+\psi_1) + (\tfrac{3}{4}c_3 V_0^3 + \tfrac{5}{8}c_5 V_0^5)\cos(a_0+\phi+\psi_3+\psi_5) \quad (3)$$

$$+ \tfrac{1}{2}c_2 V_0^2 + \tfrac{3}{8}c_4 V_0^4 \quad (4)$$

$$+ (\tfrac{1}{2}c_2 V_0^2 + \tfrac{1}{2}c_4 V_0^4)(\cos(2a_0+2\phi+2\psi_2+2\psi_4)) \quad (5)$$

where the first line (3) is the inband response with AM-AM & AM-PM nonlinear effects, the second line (4) is the DC bias, and the third line (5) includes all the higher frequency harmonics. At the receiving side, we may just have (3) left because all the other items will be canceled by bandpass filtering.

If x(n) consists of two frequencies, i.e., x(n)=$V_1$ cos($a_1$+φ$_1$)+$V_2$ cos($a_2$+φ$_2$), where $a_i$=2π$f_i$n, then the inband response includes many more items, such as the first order items $c_i V_i$ cos($a_i$+φ$_i$+$\psi_i$), the third order items $c_3(V_i^3+V_i V_j^2)$cos($a^i$+φ$_i$+$\psi_i$), the fifth order items $c_5(V_i^5+V_i V_j^4+V_i V_j^2)$cos($a_i$+φ$_i$+$\psi_i$), for i,j∈{1,2}. There are also intermodulation items that consist of $na_i \pm ma_j$ as long as they are within the passband of the bandpass filter, such as $(V_i^2 V_j + V_i^2 V_j^3 + V_1^4 V_j)$cos($2a_i - a_j + 2\phi_i - \phi_j + 2\psi_i - \psi_j$).

There are many other higher order items with frequencies $na_i$, $n(a_i \pm a_j)$, or $na_i + ma_j$, that cannot pass the passband filter. One of the important observations is that the contents that can pass the passband filter consist of odd-order nonlinearity only.

If x(n) consists of three or more frequencies, we can have similar observations, albeit the expressions are more complex. Let the input signal x(n) be $$x(n) = \sum_{i=1}^{3} V_i \cos(a_i), \ a_i = 2\pi f_i n \quad (6)$$

Based on [22], the nonlinear distorted output response y(n)=f(x(n)) can be written as $$y(n) = \sum_{i=1}^{\infty} k_i x_i(n) \quad (7)$$

where $k_i$ represents the gain coefficients for the $i^{th}$ order components. The 1st order component is simply $k_1 x(n)$. The 2nd order component includes the DC component, the sum/difference of beat components, and the second-order harmonic components. Specifically, $$k_2 x^2(n) = g_{2,0} + g_{2,1}(n) + g_{2,2}(n) \quad (8)$$

where $$g_{2,0} = \sum_{i=1}^{3} V_i^2/2(n)$$

$$g_{2,1} = \sum_{i=1}^{3} \sum_{j \neq i} V_i V_j \cos(a_i \pm a_j)$$

$$g_{2,2} = \sum_{i=1}^{3} V_i^2 \cos(2a_i)/2.$$

The 3rd order component includes the third-order harmonic components $g_{3,1}(n)$, the third intermodulation beat components $g_{3,2}(n)$, the triple beat components $g_{3,3}(n)$, the self-compression/expansion components $g_{3,4}(n)$, and the cross-compression/expansion components $g_{3,5}(n)$.

This gives $$k_3 x^3(n) = \sum_{i=1}^{5} g_{3,i}(n)$$

Where $$g_{3,1}(n) = \frac{1}{4}\sum_{i=1}^{3} A_i^3 \cos(3a_i)/4$$

$$g_{3,2}(n) = \frac{3}{4}\sum_{i=1}^{3}\sum_{j \neq i} A_i^2 A_j \cos(2a_i \pm 2a_j)$$

$$g_{3,3}(n) = \frac{3}{2}\left(\prod_{i=1}^{3} A_j\right)\cos\left(\sum_{i=1}^{3}(\pm a_i)\right)$$

$$g_{3,4}(n) = \frac{3}{4}\sum_{i=1}^{3} A_i^3 \cos(a_i)$$

$$g_{3,5}(n) = \frac{3}{2}\sum_{i=1}^{3}\sum_{j \neq i} A_i A_j^2 \cos(a_j)$$

The 4th order component includes the DC components $g_{4,0}$, the fourth-order harmonic components $g_{4,1}(n)$, the fourth intermodulation beat components $g_{4,2}(n)$, the sum/difference beat components $g_{4,3}(n)$, the second harmonic components $g_{4,5}(n)$. This gives $$k_4 x^4(n) = \sum_{i=0}^{5} g_{4,i}(n)$$

where $$g_{4,0} = \frac{3}{8}\sum_{i=1}^{3} A_i^4 + \frac{3}{4}\sum_{i=1}^{3}\sum_{j \neq i} A_i^2 A_j^2$$

$$g_{4,1} = \frac{1}{8}\sum_{i=1}^{3} A_i^4 \cos(4a_j)$$

$$g_{4,2} =$$

$$\frac{4}{8}\sum_{i=1}^{3}\sum_{j \neq i} A_i^3 A_j \cos(3a_j \pm a_j) + \frac{12}{8}\sum_{i=1}^{3} A_i^2 \left(\prod_{j \neq i} A_j\right)\cos\left(2a_j \sum_{j \neq i}(\pm a_j)\right)$$

$$g_{4,3} = \frac{6}{4}\sum_{i=1}^{3} \cos(a_j \pm a_{mod(i+1,3)})$$

$$\left(A_i^2 A_{mod(i+1,3)}^2 + A_i A_{mod(i+1,3)}^3 + A_i^3 A_{mod(i+1,3)} + \prod_{j=1}^{3} A_i\right)$$

$$g_{4,4} = \frac{3}{2}\sum_{i=1}^{3} \cos(2a_j)\left(A_i^2 \sum_{j=1}^{3} A_j^2\right)$$

The 5th order component includes the fifth-order harmonic components $g_{5,1}(n)$, the fifth intermodulation beat components $g_{5,2}(n)$, the self-compression/expansion components $g_{5,3}(n)$, the cross-compression/expansion components $g_{5,4}(n)$, the third harmonic components $g_{5,5}(n)$, the third intermodulation beat components $g_{5,6}(n)$, and the triple beat components $g_{5,7}(n)$. This gives $$k_5 x^5(n) = \sum_{i=1}^{5} g_{5,i}(n)$$

Where $$g_{5,1}(n) = \frac{1}{5}\sum_{i=1}^{3} A_i^5 \cos(5a_i)$$

$$g_{5,2}(n) = \frac{5}{8}\sum_{i=1}^{3}\sum_{j \neq i} A_i A_j^4 \cos(a_j \pm 4a_j) +$$

$$A_i^2 A_j^3 \cos(2a_i \pm 3a_j) + A_i^3 A_j^2 \cos(3a_j \pm 2a_j) + A_i^4 A_j \cos(4a_j \pm a_j)$$

$$g_{5,3}(n) = \frac{5}{8}\sum_{i=1}^{3} A_i^5 \cos(a_i)$$

$$g_{5,4}(n) = \frac{15}{4}\sum_{i=1}^{3} \cos(a_i)\left(\sum_{j \neq i}(A_i^3 A_j^2 + A_i A_j^4) + A_j \prod_{j \neq i} A_j^2\right)$$

$$g_{5,5}(n) = \frac{5}{4}\sum_{i=1}^{3} \cos(3a_i)\left(A_i^3 \sum_{j=1}^{3} A_j^2\right)$$

$$g_{5,6}(n) = \frac{15}{4}\sum_{i=1}^{3}\sum_{j \neq i} \cos(2a_i \pm a_j) \times \left(A_i^3 A_j^2 + A_i^4 A_j + A_i^2 A_j \prod_{k \neq i,j} A_k^2\right)$$

$$g_{5,7}(n) = \frac{15}{8}\cos\left(\sum_{i=1}^{3}(\pm a_i)\right)\left(\sum_{i=1}^{3} A_i \prod_{j \neq i} A_j^2 + \sum_{i=1}^{3} A_i^3 \prod_{j \neq i} A_j\right)$$

These nonlinear spectrum growth expressions can be similarly applied if the signal x(n) is the QAM or OFDM signal. Especially, the harmonics provides us a way to design the input signal vectors for DNN equalizers. Note that some of the spectrums that are deviated too much from the transmitted signal bandwidth will be attenuated by the receiver bandpass filters.

DNN-Based Nonlinear Equalization

A. Nonlinear Equalizer Models

To mitigate the PA nonlinear distortions, nonlinear equalizers can be applied at the receivers. Obviously, the Volterra series model can still be used to analyze the response of nonlinear equalizers. One of the differences from (2) is that the even order nonlinearity may still be included and may increase the nonlinear mitigation effects [5].

Consider the system block diagram of nonlinear equalization shown in FIG. 1, which shows a signal x(n) entering a nonlinear power amplifier, to produce a distorted signal y(n), which passes through a channel hi, which produces a response r(n), which is fed to a neural network equalizer to produce a corrected output z(n).

Let the received signal be $$r(n) = \sum_{\ell=0}^{L} h_\ell y(n - \ell) + v(n), \quad (9)$$

where $h_i$ is the finite-impulse response (FIR) channel coefficients and v(n) is additive white Gaussian noise (AWGN). With the received sample sequence r(n), a nonlinear equalizer will generate z(n) as the estimated symbols.

If the PA has only slight nonlinearity as modeled by the simple "AM-AM AM-PM" model (1), the received samples r(n) may be stacked together into M+1 dimensional vectors $r(n)=[r(n), \ldots, r(n-M)]^T$, where $(\cdot)^T$ denotes transpose, and write the received samples in vector form as $$r(n)=HG(n)x(n)+v(n) \quad (10)$$

where H is an (M+1)×(M+L+1) dimensional channel matrix $$H = \begin{bmatrix} h_o & \cdots & h_L & & \\ & \ddots & & \ddots & \\ & & h_o & \cdots & h_L \end{bmatrix} \text{ and} \quad (11)$$

$$G(n) = \text{diag}\{V_{y(n)}e^{j\psi_{y(n)}}, \cdots, V_{n(y-M-L)}e^{j\psi_{y(n-M-L)}}\}$$

is an (M+L+1)×(M+L+1) dimensional diagonal matrix which consists of the nonlinear PA responses, $x(n)=[x(n), \ldots, x(n-M-L)]^T$, and $v(n)=[v(n), \ldots v(n-M)]^T$. To equalize the received signal, we apply a nonlinear equalizer with the form $$f^T = G'(n)[f_0, \ldots, f_M] \quad (12)$$

where $[f_0, \ldots, f_M]H \approx [0, \ldots, 1, \ldots, 0]$ is to equalize the propagation channel, and $$G'(n) \approx \frac{1}{V_{y(n-d)}} e^{-j\psi_{y(n-d)}}$$

is to equalize the nonlinear PA response. Let $\hat{r}(n)$ be the output of the first linear equalization step. The second nonlinear equalization step can be implemented as a maximum likelihood estimation problem, i.e., $z(n) = \arg\min_{\forall x(n)} |\hat{r}(n) - V_y e^{j\psi_y} x(n)|^2$. This gives the output $$z(n) = f^T r(n) \approx x(n-d) \quad (13)$$

with certain equalization delay d.

Both the channel coefficients $h_\ell$ and the nonlinear PA responses $V_y$, $\psi_y$ can be estimated via training, as can the channel equalizer $f^T$. Because the PA nonlinearity is significant for large signal amplitude only, we can apply small-amplitude training signals $x(n)$ first to estimate the channel $h_l$ and the channel equalizer $[f_0, \ldots, f_M]$. We can then remove the channel H from (10) with the first step linear channel equalization. Because the matrix G(n) is diagonal, we can easily estimate G(n) with regular training and then estimate the transmitted symbols as outlined in (13).

For more complex nonlinear PA responses, such as (2), we can conduct channel equalization similarly as (12). First, we can still apply small-amplitude training signals to estimate $[f_0, \ldots, f_M]$ so as to equalize the channel $h_\ell$. This linear channel equalization step gives $\hat{r}(n) \approx y(n)$. We can then focus on studying the equalization of nonlinear distortion of the PA, which can in general be conducted with the maximum likelihood method, $$\{\hat{x}(n): n = 0, \cdots, N\} = \arg\min_{\{x(n)\}} \sum_{n=0}^{N} |\hat{r}(n) - \hat{y}(n)|^2, \quad (14)$$

where $\hat{r}(n)$ is the sequence after the linear channel equalization, $\hat{y}(n)$ is the sequence reconstructed by using the sequence $x(n)$ and the nonlinear PA response parameters $b_{kd}$ based on (2), and N is the total number of symbols. The optimization problem (14) can be solved with the Viterbi sequence estimation algorithm if the memory length of the PA is small enough and the PA nonlinear response is known to the receiver.

In case the PA nonlinear response cannot be estimated, the equalization of nonlinear PA response is challenging. In this case, one of the ways is to use the conventional Volterra series equalizer, which approximates G'(n) with a Volterra series model. Similar to (2), this gives $$z(n) = \sum_{d=0}^{D} \sum_{\nu=0}^{P} g_{kd} \hat{r}(n-d) |\hat{r}(n-d)|^{k-1}. \quad (15)$$

The objective of the Volterra series equalizer design is to design $g_{kd}$ such that $z(n) \approx x(n-\ell)$ for some equalization delay $\ell$.

Similarly, as the DPD design of [5], based on the Volterra series model (15), we can estimate the coefficients $g_{kd}$ by casting the estimation into a least squares problem $$\min_{\{g_{kd}\}} \sum_{n=L}^{N} \left| x(n-L) - \sum_{d=0}^{D} \sum_{k=1}^{P} g_{kd} \hat{r}(n-d) |\hat{r}(n-d)|^{k-1} \right|^2, \quad (16)$$

with training symbols $x(n)$ and received samples $\hat{r}(n)$. Note that only the coefficients $g_{kd}$ are needed to be estimated, and these coefficients are linear with respect to $\hat{r}(n)$ and $x(n)$.

Define the vector $a = [g_{00}, g_{01}, \ldots, g_{PD}]^T$, and the vector $x = [x(0); \ldots, x(N-L)]^T$. Define the (N−L+1)×DP data matrix $$B = \begin{bmatrix} \hat{r}(L) & \hat{r}(L)|\hat{r}(L)| & \cdots & \hat{r}(L-D)|\hat{r}(L-D)|^{P-1} \\ \vdots & & & \vdots \\ \hat{r}(N) & \hat{r}(N)|\hat{r}(N)| & \cdots & \hat{r}(N-D)|\hat{r}(N-D)|^{P-1} \end{bmatrix} \quad (17)$$

Then, (16) becomes $$\min_a \|x - Ba\|^2 \quad (18)$$

Solution to (18) is $$a = B^+ x \quad (19),$$

where $B^+ = (B^H B)^{-1} B$ is the pseudo-inverse of the matrix B. From (19), we can obtain the Volterra series equalizer coefficients $g_{kd}$. One of the major problems for the Volterra series equalizer is that it is hard to determine the order sizes, i.e., the values of D and P. Even for a nonlinear PA with slight nonlinear effects (i.e., small D and P in (2)), the length of D and P for Volterra series equalizer may be extremely long in order for (15) to have sufficient nonlinearity mitigation capability.

A potential way to resolve this problem is to apply artificial neural networks to fit the nonlinear equalizer response (15). Neural networks can fit arbitrary nonlinearity and can realize this with potentially small sizes. Nevertheless, in conventional neural network equalizers such as [14] [15], the input (features) to the neural networks was simply a time-delayed vector $[r(n), \ldots, r(n-M)]$. Although neural networks may have the capability to learn the nonlinear effects specified in (15), in practice the training may not necessarily converge to the desirable solutions due to local minimum and limited training data. In addition, conventional neural network equalizers were all feed-forward networks with fully connected layers only, which often suffer from problems like shallow network architecture and overfitting.

It is therefore an object to provide a radio receiver, comprising: an input configured to receive a transmitted radio frequency signal representing a set of symbols communicated through a communication channel; a Volterra series processor configured to decompose the transmitted radio frequency signal as a Volterra series expansion; an equalizer, comprising a deep neural network trained with respect to channel distortion, receiving the Volterra series expansion; and an output, configured to present data corresponding to a reduced distortion of the received distorted transmitted radio frequency signal.

It is also an object to provide a radio reception method, comprising: receiving a transmitted radio frequency signal representing a set of symbols communicated through a communication channel; decomposing the transmitted radio frequency signal as a Volterra series expansion; equalizing the Volterra series expansion with a deep neural network trained with respect to channel distortion, receiving the Volterra series expansion; and presenting data corresponding to a reduced distortion of the received transmitted radio frequency signal.

It is a further object to provide an equalization method for a radio signal, comprising: storing parameters for decomposition of a received radio frequency signal as a Volterra series expansion; processing the Volterra series expansion in a deep neural network comprising a plurality of neural network hidden layers and at least one fully connected neural network layer, trained with respect to radio frequency channel distortion; and presenting an output of the deep neural network. The method may further comprise demodulating the output of the deep neural network, wherein a bit error rate of the demodulator is reduced with respect to an input of the received radio frequency signal to the demodulator.

It is another object to provide an equalizer for a radio receiver, comprising: a memory configured to store parameters for decomposition of a received radio frequency signal as a Volterra series expansion; a deep neural network comprising a plurality of neural network hidden layers and at least one fully connected neural network layer, trained with respect to radio frequency channel distortion, receiving the Volterra series expansion of the received radio frequency signal; and an output configured to present an output of the deep neural network. The system may further comprise a demodulator, configured to demodulate the output, wherein a bit error rate of the demodulator is reduced with respect to an input of the received radio frequency signal to the demodulator.

The Volterra series expansion may comprise at least third or fifth order terms.

The deep neural network may comprise at least two or three convolutional network layers. The deep neural network may comprise at least three one-dimensional convolutional network layers. The convolutional layers may be hidden layers. The deep neural network may comprise at least three one-dimensional layers, each layer having at least 10 feature maps. The radio receiver may further comprise a fully connected layer subsequent to the at least three layers.

The distorted transmitted radio frequency signal comprises an orthogonal frequency multiplexed (OFDM) signal, a quadrature amplitude multiplexed (QAM) signal, a QAM-16 signal, a QAM-64 signal, a QAM-256 signal, a quadrature phase shift keying (QPSK) signal, a 3G signal, a 4G signal, a 5G signal, a WiFi (IEEE-802.11 standard family) signal, a Bluetooth signal, a cable broadcast signal, an optical transmission signal, a satellite radio signal, etc.

The radio receiver may further comprise a demodulator, configured to demodulate output as the set of symbols.

BRIEF DESCRIPTION OF THE DRAWINGS

FIG. 3A: received signal. FIG. 3B: Volterra equalizer output. FIG. 3C: time-delayed NN output. FIG. 3D: Volterra+NN output.

FIG. 4A: received signal. FIG. 4B: Volterra equalizer output. FIG. 4C: time-delayed NN output. FIG. 4D: Volterra+NN output.

FIG. 6: shows a table comparing MSE/SER improvement in percentage for the three equalization methods.

DETAILED DESCRIPTION OF THE PREFERRED EMBODIMENTS

Volterra-Based DNN Equalizer

Figure 1:
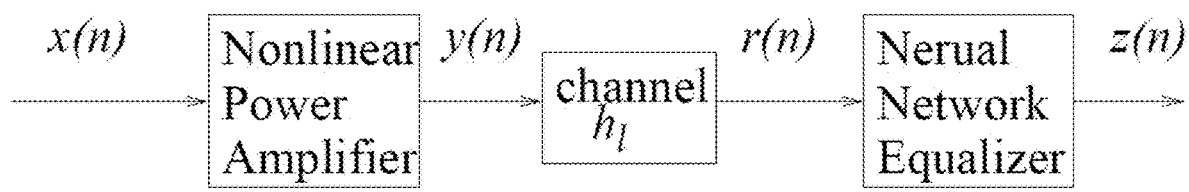
FIG. 1 shows a system block diagram with nonlinear power amplifier and deep neural network equalizer.
Figure 2:
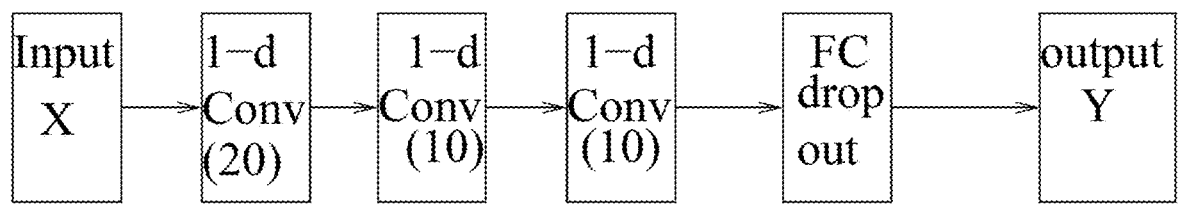
FIG. 2 shows a block diagram of DNN equalizer.
Figure 3A:
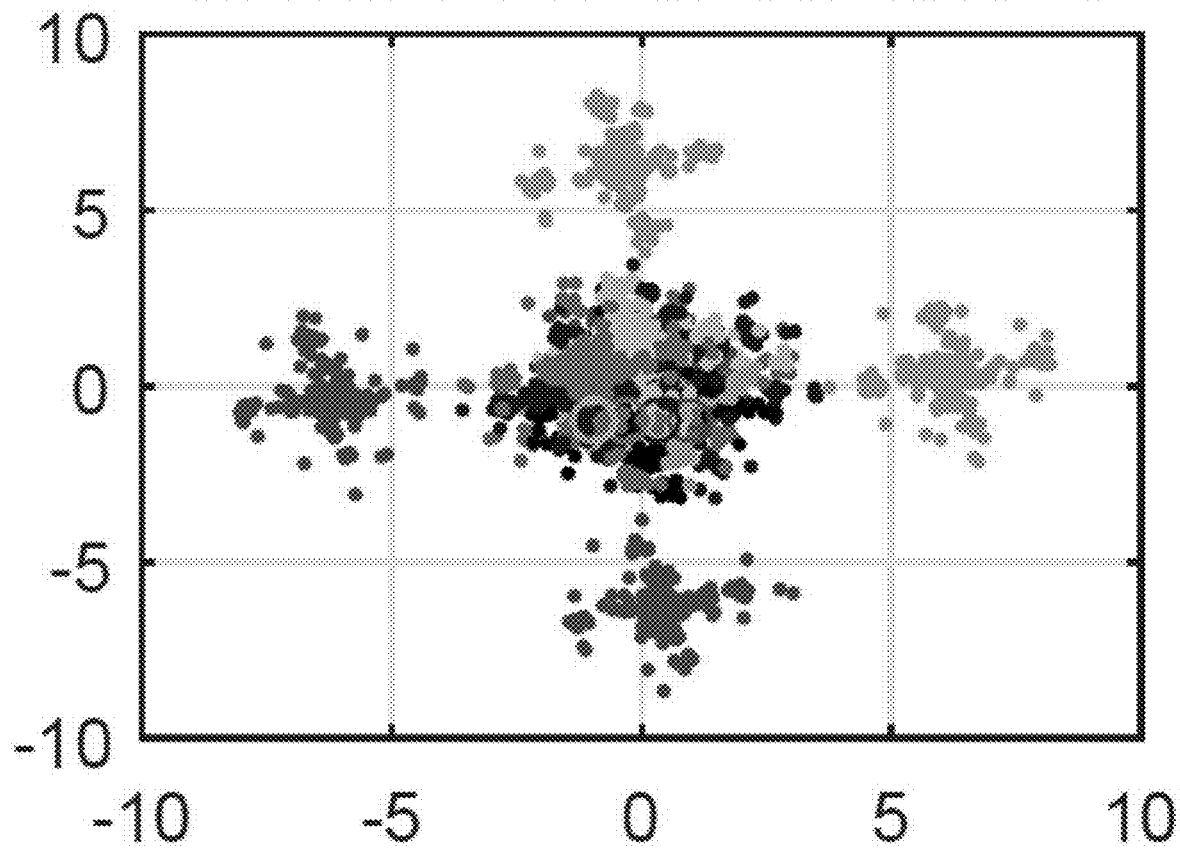
FIGS. 3A-3D show constellations of 16QAM over a simulated PA.
Figure 3B:
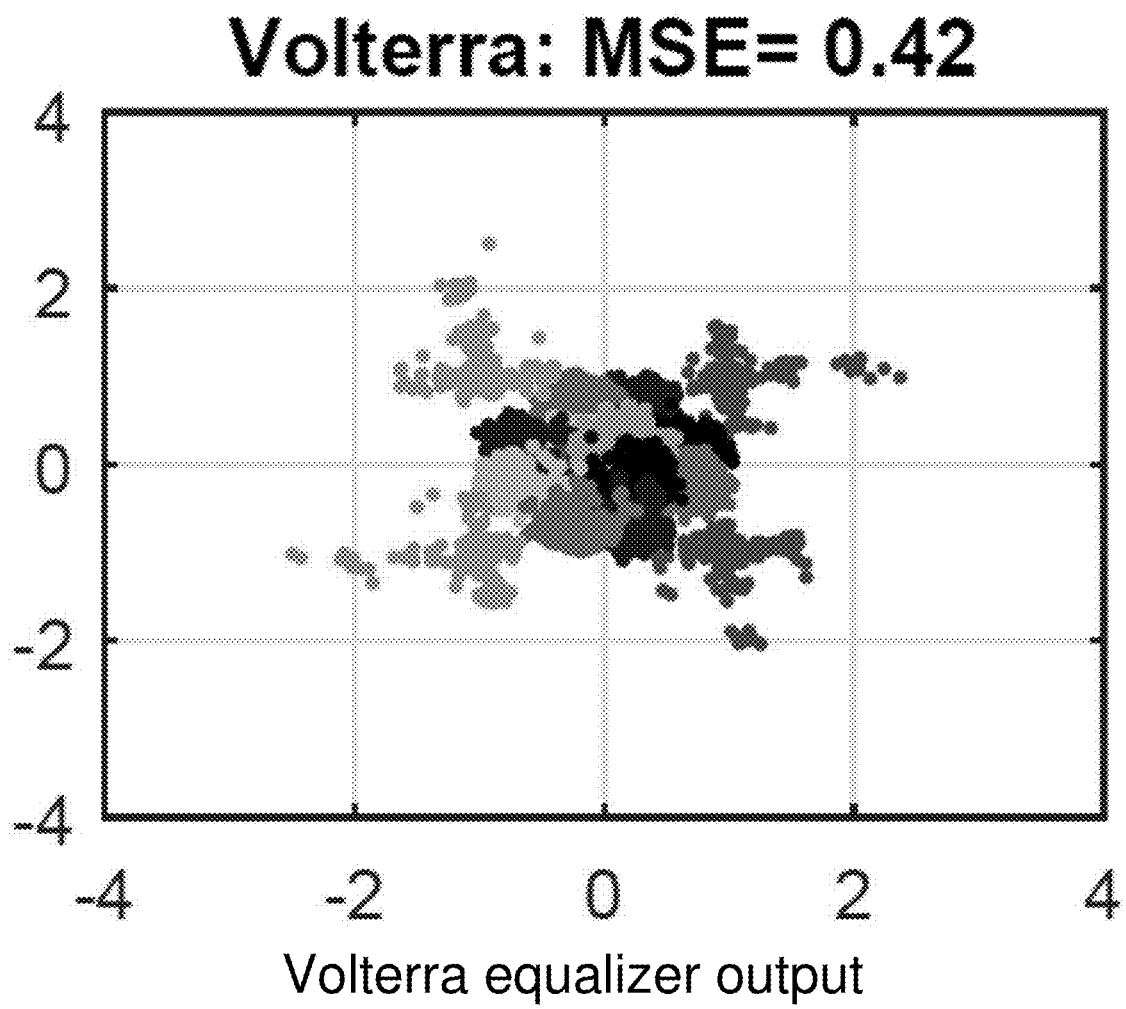
Figure 3C:
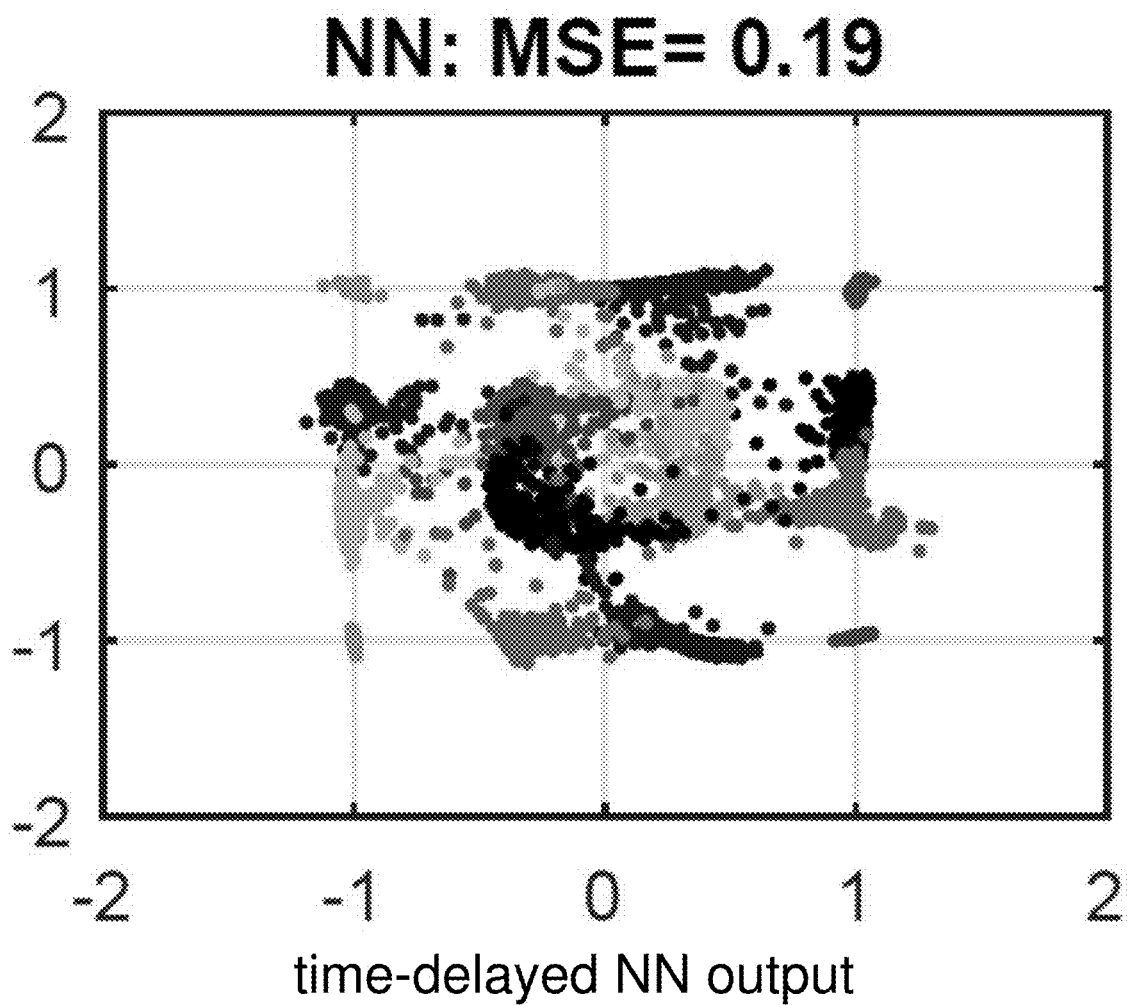
Figure 3D:
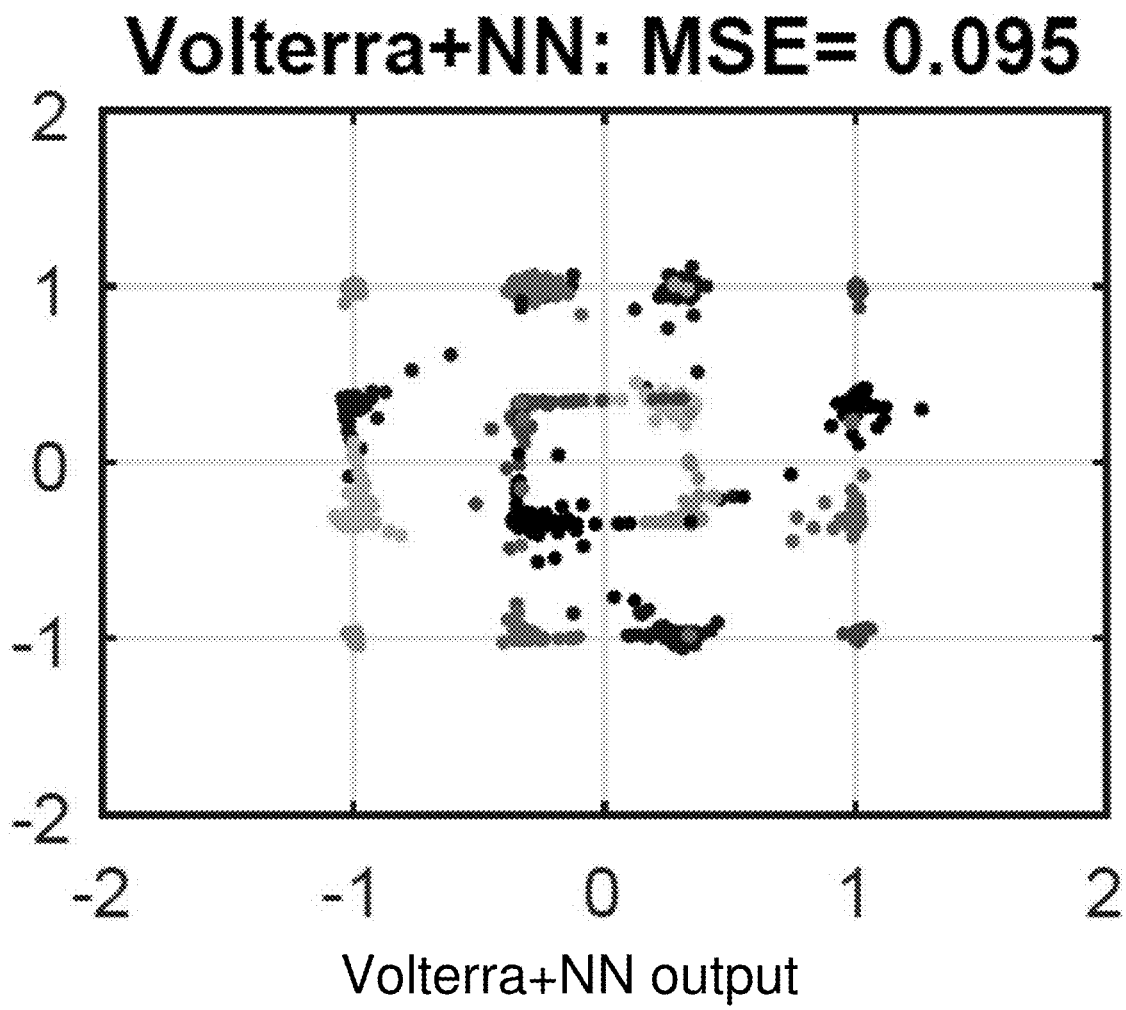
Figure 4A:
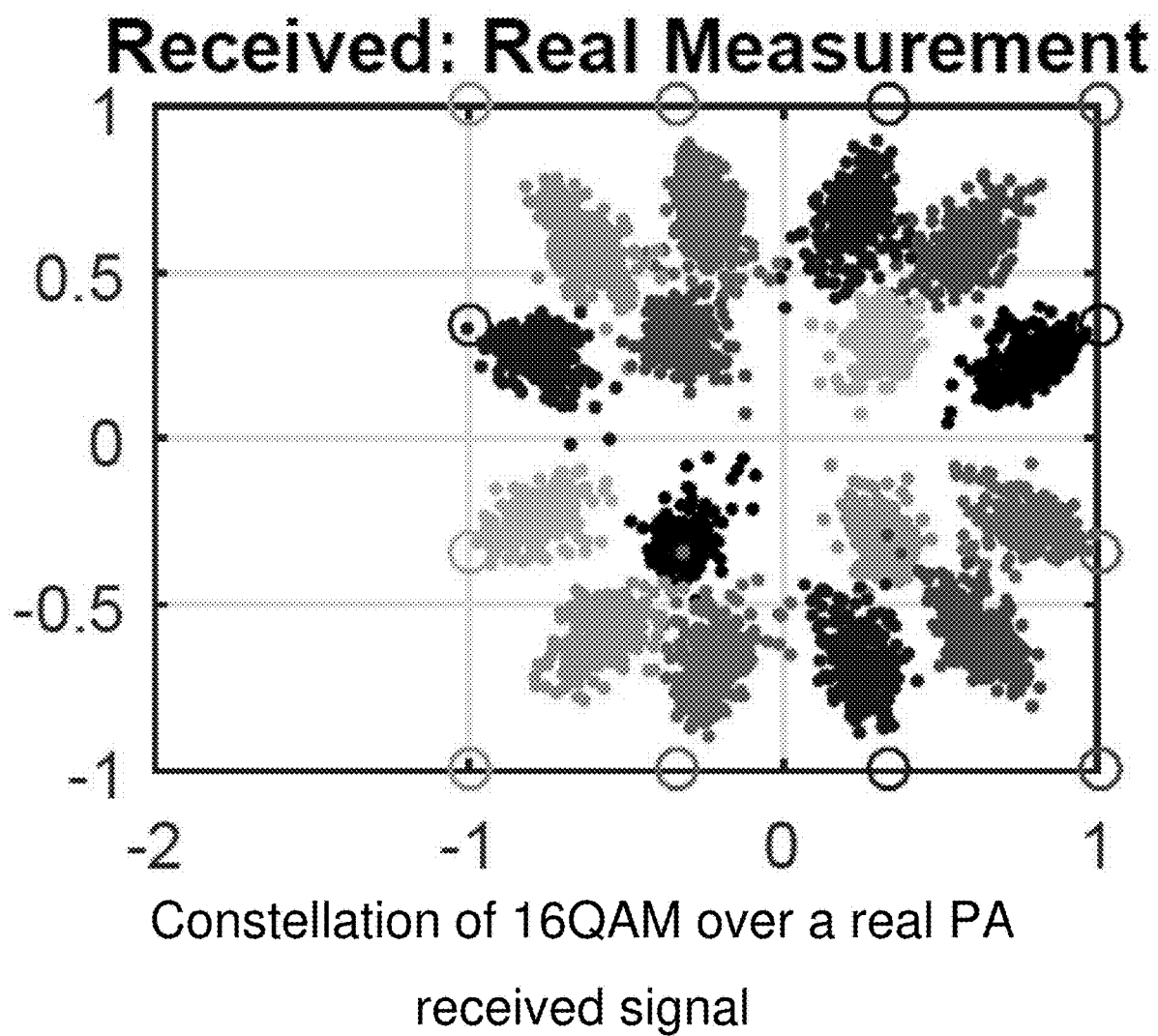
FIGS. 4A-4D show constellation of 16QAM over a real PA.
Figure 4B:
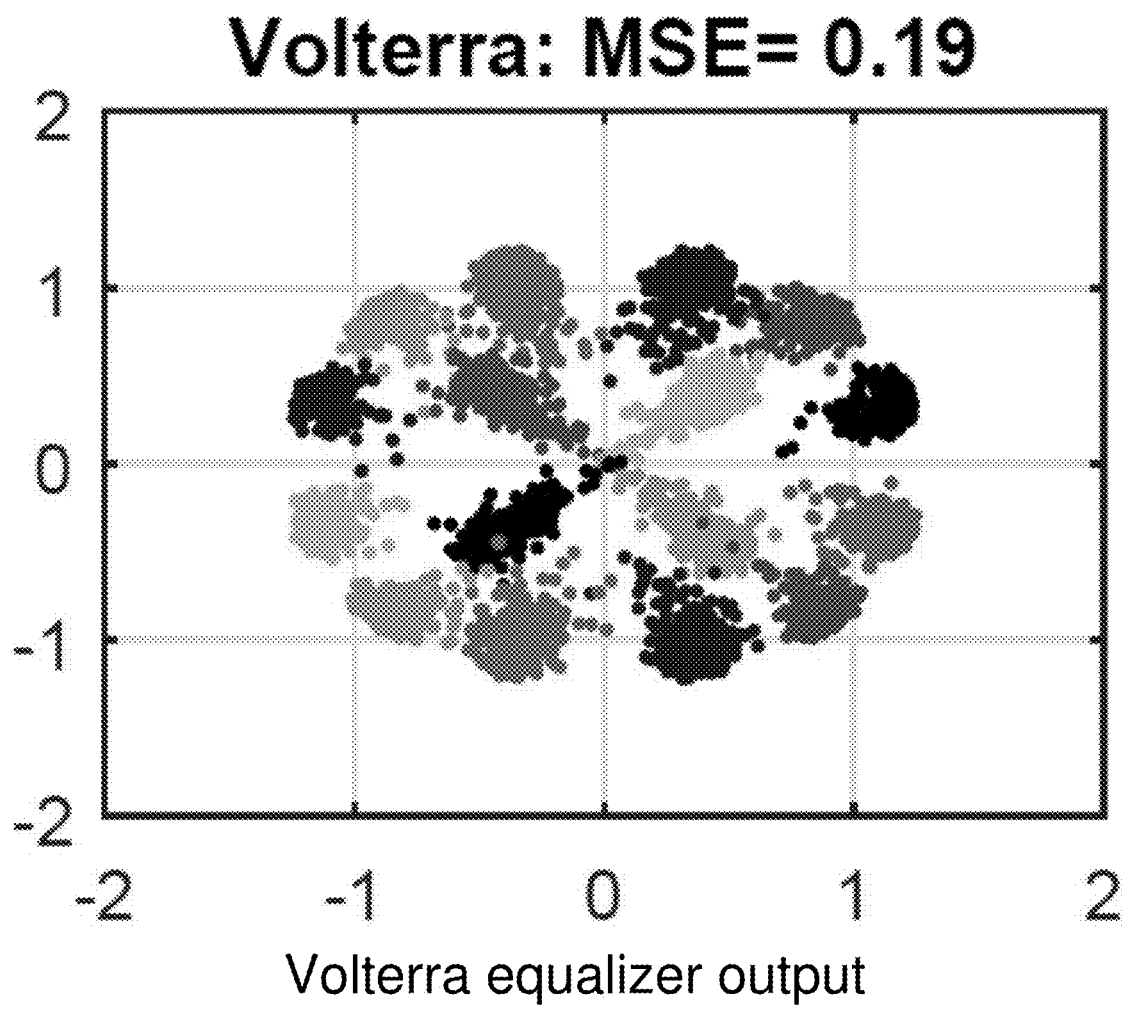
Figure 4C:
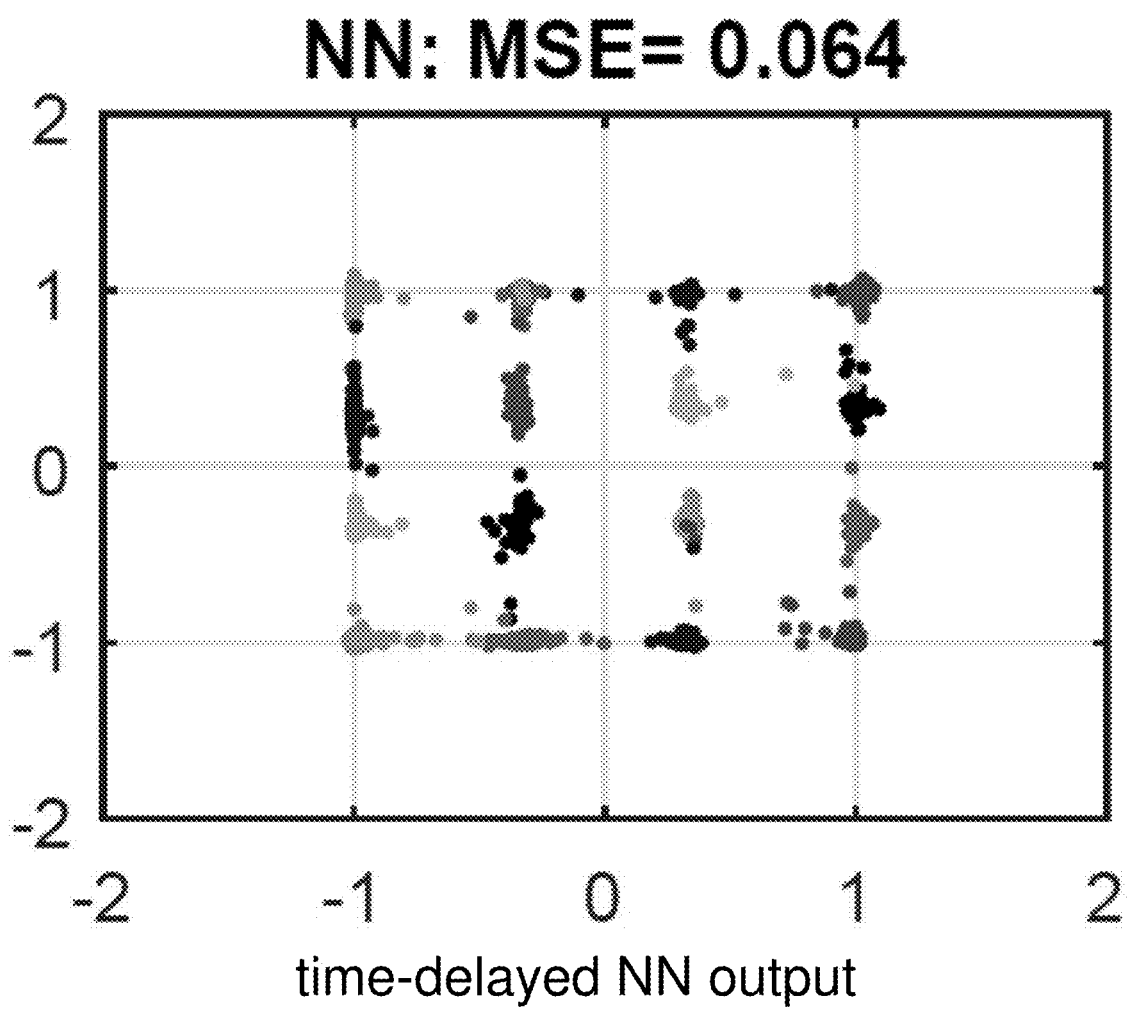
Figure 4D:
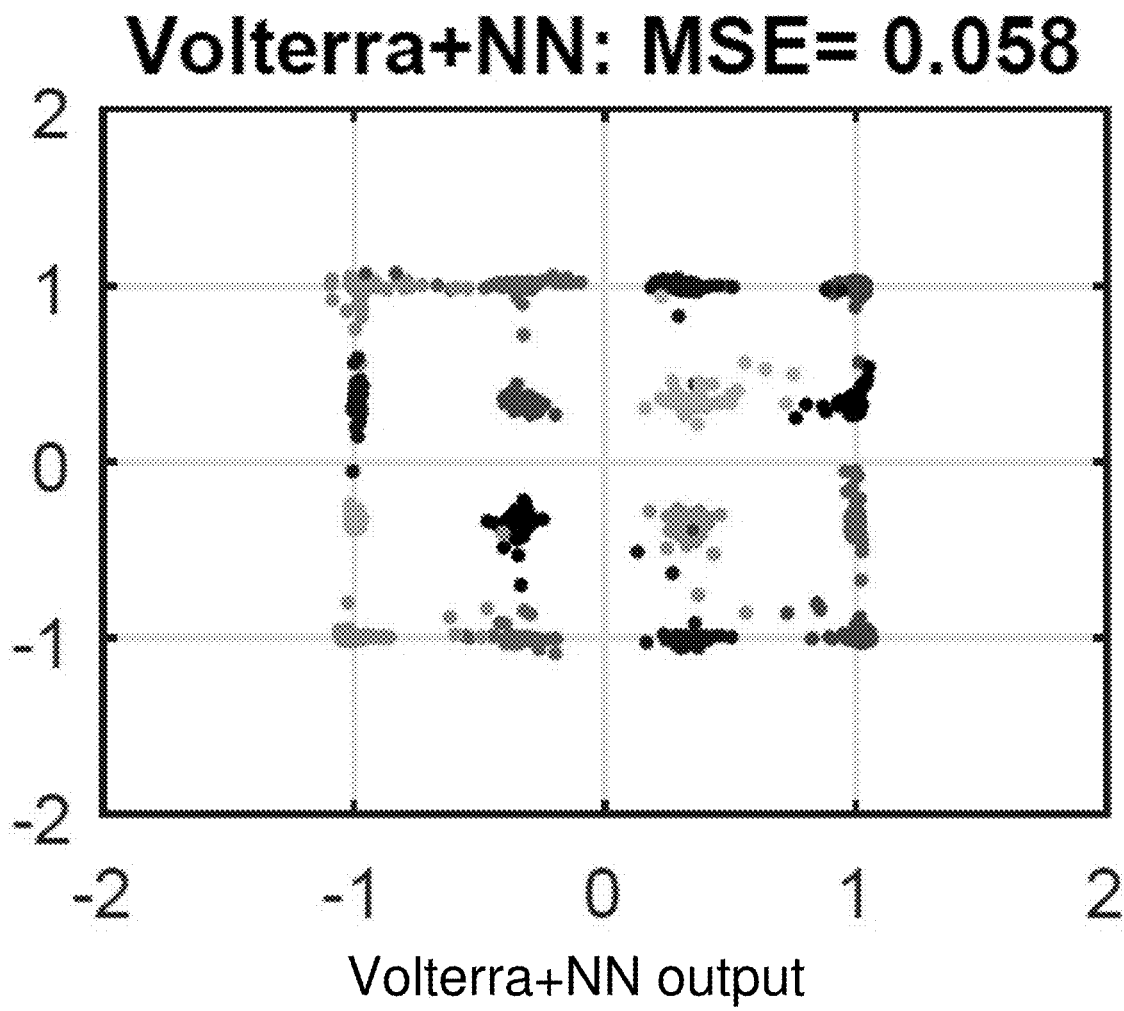

The present technology therefore employs deep neural networks to implement the nonlinear equalizer in the receiver, which can mitigate the nonlinear effects of the received signals due to not only PAs but also nonlinear channels and propagations. The architecture of the DNN equalizer is shown in FIG. 2, which shows an input X, which undergoes a series of three 1-d convolutions, am FC dropout, to produce the output Y.

Different from [10] B. Li, C. Zhao, M. Sun, H. Zhang, Z. Zhou, and A. Nallanathan, "A Bayesian approach for nonlinear equalization and signal detection in millimeter-wave communications," IEEE Transactions on Wireless Communications, vol. 14, no. 7, pp. 3794-3809, 2015, multi-layer convolutional neural networks (CNNs) are employed. Different from conventional neural network predistorters proposed in [6] M. Rawat, K. Rawat, and F. M. Ghannouchi, "Adaptive digital predistortion of wireless power amplifiers/transmitters using dynamic realvalued focused time-delay line neural networks," IEEE Transactions on Microwave Theory and Techniques, vol. 58, no. 1, pp. 95-104, 2010., neural networks are used as equalizers at the receivers. Different from conventional neural network equalizers such as those proposed in [14] [15] D.-C. Park and T.-K. J. Jeong, "Complex-bilinear recurrent neural network for equalization of a digital satellite channel," IEEE Transactions on Neural Networks, vol. 13, no. 3, pp. 711-725, 2002; A. Uncini, L. Vecci, P. Campolucci, and F. Piazza, "Complex-valued neural networks with adaptive spline activation function for digital-radio-links nonlinear equalization," IEEE Transactions on Signal Processing, vol. 47, no. 2, pp. 505-514, 1999, in the present DNN equalizer, not only the linear delayed samples r(n), but also the CNN and the input features in X are used. The Volterra series models are applied to create input features.

We can assume that the linear channel H has already been equalized by a linear equalizer, whose output signal is r(n). In fact, this equalization is not required, but simplifies the presentation of the analysis.

According to Volterra series representation of nonlinear functions, the input-output response of the nonlinear equalizer can be written as $$z(n) = \sum_{k=1}^{P} \sum_{d_1=0}^{D} \cdots \sum_{d_k=0}^{D} f_{d_1,\cdots,d_k} \prod_{i=1}^{k} r(n-d_i). \quad (20)$$

One of major problems is that the number of coefficients $f_{d_1, \ldots, d_k}$ increases exponentially with the increase of memory length D and nonlinearity order P. There are many different ways to develop more efficient Volterra series representations with reduced number of coefficients. For example, [23] J. Staudinger, J.-C. Nanan, and J. Wood, "Memory fading volterra series model for high power infrastructure amplifiers," in Radio and Wireless Symposium (RWS), 2010 IEEE. IEEE, 2010, pp. 184-187, exploits the fact that higher-order terms do not contribute significantly to the memory effects of PAs to reduce the memory depth d when the nonlinearity order k increases.

This technique can drastically reduce the total number of coefficients. In [24] [25] [26] A. Zhu, J. C. Pedro, and T. J. Brazil, "Dynamic deviation reduction-based volterra behavioral modeling of rf power amplifiers," IEEE Transactions on microwave theory and techniques, vol. 54, no. 12, pp. 4323-4332, 2006; A. Zhu, P. J. Draxler, J. J. Yan, T. J. Brazil, D. F. Kimball, and P. M. Asbeck, "Open-loop digital predistorter for rf power amplifiers using dynamic deviation reduction-based volterra series," IEEE Transactions on Microwave Theory and Techniques, vol. 56, no. 7, pp. 1524-1534, 2008; L. Guan and A. Zhu, "Simplified dynamic deviation reduction-based volterra model for doherty power amplifiers," in Integrated Nonlinear Microwave and Millimetre-Wave Circuits (INMMIC), 2011 Workshop on. IEEE, 2011, pp. 1-4, developed a dynamic deviation model to reduce the full Volterra series model (20) to the following simplified one:

$$z(n) = z_s(n) + z_d(n) =$$
$$\sum_{k=1}^{P} f_{k,0} r^k(n) + \sum_{k=1}^{P} \sum_{j=1}^{k} r^{k-j}(n) \sum_{d_1=0}^{D} \cdots \sum_{d_j=d_{j-1}}^{D} f_{k,j} \prod_{i=1}^{j} r(n-d_i)$$

where $z_s(n)$ is the static term, and $z_d(n)$ is the dynamic term that includes all the memory effects. We can see that the total number of coefficients can be much reduced by controlling the dynamic order j which is a selectable parameter.

We construct the input features of the DNN based on the model (21). Corresponding to the static term $z_s(n)$, we change it to:

$$\hat{z}_s(n) = \sum_{1 \leq k \leq P} f_{k,0} r(n) |r(n)|^{k-1}.$$

The reason that (22) changes $r^k(n)$ to $r(n)|r(n)|^{k-1}$ is that only the signal frequency within the valid passband is interested. This means the input feature vector X should include terms $r(n)|r(n)|^{k-1}$. Similarly, corresponding to the dynamic term zd(n), we need to supply $r^{k-j}(n)\Pi_{i=1}^{j} r(n-d_i)$ in the features where half of the terms r(n) and $r(n-d_i)$ should be conjugated. For simplicity, in the DNN equalizer, the vector X includes $r(n-q)|r(n-q)|^{k-1}$ for some q and k.

By applying Volterra series components directly as features of the input X, the DNN can develop more complex nonlinear functions with a fewer number of hidden layers and a fewer number of neurons. This will also make the training procedure converge much faster with much less training data.

In FIG. 2, the input X is a tensor formed by the real and imaginary parts of $r(n-q)|r(n-q)|^{k-1}$ with appropriate number of delays q and nonlinearities k. There are three single dimension convolutional layers, each with 20 or 10 feature maps. After a drop-out layer for regularization, this is followed by a fully connected layer with 20 neurons. Finally, there is a fully-connected layer to form the output tensor Y which has two dimensions. The output Y is used to construct the complex z(n), where $z(n)=\hat{x}(n-d)$ for some appropriate delay d. All the convolutional layers and the first fully connected layer use the sigmoid activation function, while the output layer uses the linear activation function. The mean square error loss function $L^{loss}=E[|x(n-d)-z(n)|^2]$ is used, where z(n) is replaced by Y and x(n-d) is replaced by training data labels.

Experiment Evaluations

Experiments are presented on applying the Volterra series based DNN equalizer (Volterra+NN) for nonlinear PA equalization. The (Volterra+NN) scheme with the following equalization methods: a Volterra series-based equalizer (Volterra) and a conventional time-delay neural network equalizer (NN). The performance metrics are mean square error (MSE)

$$\sqrt{E[|z(n)-x(n-d)|^2]/E[|x(n-d)|^2]}$$

and symbol error rate (SER). Both simulated signals and real measurement signals were employed. To generate simulated signals, a Doherty nonlinear PA model consisting of 3rd and 5th order nonlinearities was employed. Referring to (2), the coefficients $b_{k,q}$ were $b_{0,0:2}=\{1.0513+0.0904j, 0.068-0.0023j, 0.0289-0.0054j\}$ $b_{2,0:2}=\{-0.0542-0.29j, 0.2234+0.2317j, 0.0621-0.0932j\}$ $b_{4,0:2}=\{-0.9657-0.7028j, -0.2451-0.3735j, 0.1229+0..1508j\}$, which was used in [5] to simulate a 5th order dominant nonlinear distortion derived from PA devices used in the satellite industry. For real measurement, our measurement signals were obtained from PA devices used in the cable TV (CATV) industry, which are typically dominated by $3^{rd}$ order nonlinear distortion (NLD). Various levels of nonlinear distortion, in terms of dBc, were generated by adjusting the PAs.

For the Volterra equalizer, the approximate response of the nonlinear equalizer with delays including 8 pre- and post-main taps and with nonlinearities including even and odd order nonlinearity up to the 5th order was employed. To determine the values of the Volterra coefficients, N=4; 096 training symbols were transmitted through the PA and then collected the noisy received samples r(n).

For the conventional time-delay NN equalizer, a feedforward neural network with an 80-dimensional input vector X and 5 fully-connected hidden layers with 20, 20, 10, 10, 10 neurons, respectively, was applied.

FIG. 3 shows the constellation and MSE of the equalizer's outputs. It can be seen that the proposed scheme provides the best performance.

FIG. 4 shows the constellation of 16 QAM equalization over the real PA. The corresponding SER were 0.0067, 0.0027, 0.00025, respectively. It can be seen that the Volterra+NN scheme has the best performance.

Figure 5:
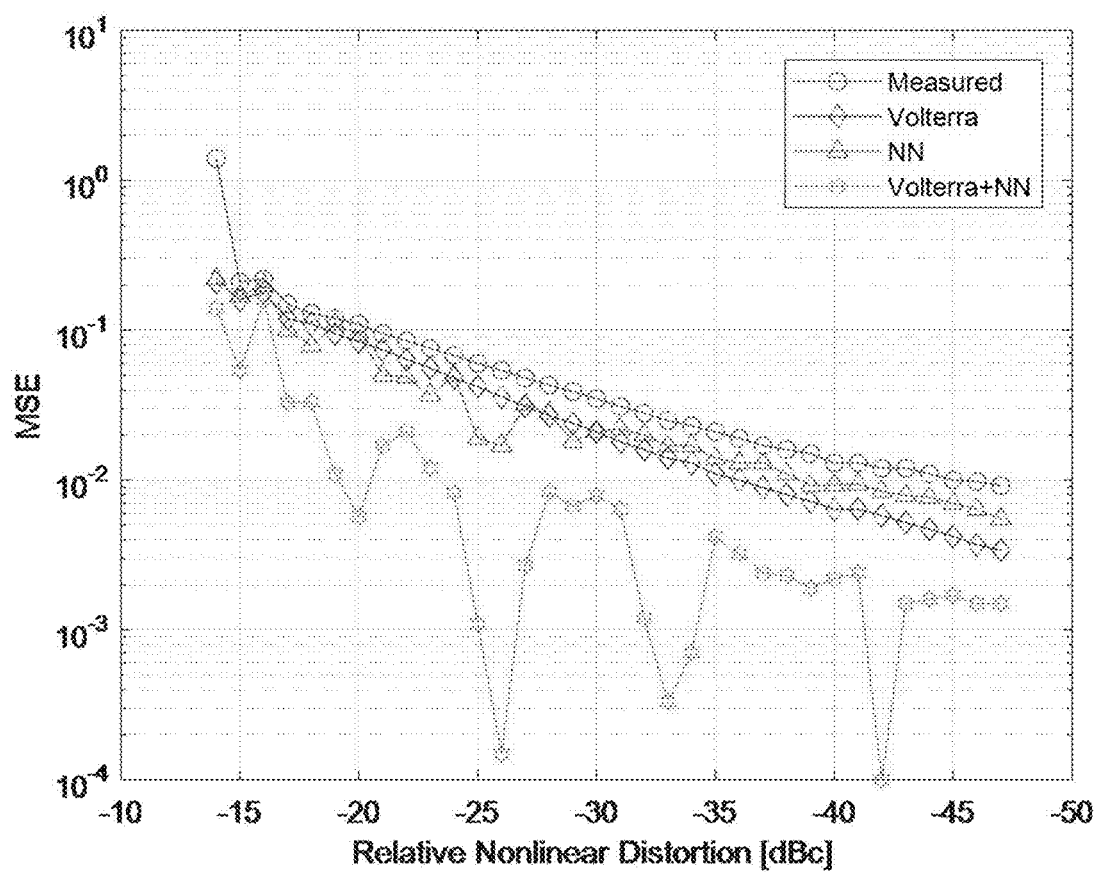
FIG. 5 shows a comparison of three equalization methods for 16-QAM under various NLD levels.

FIG. 5 provides MSE measurements for 16-QAM under various nonlinear distortion level dBc. For each 1 dB increase in NLD, the resultant MSE is shown for the "Measured", "Volterra", "NN", and the proposed "Volterra+ NN" cases. MSE reduction diminishes appreciably as modulation order increases from QPSK to 64-QAM, but small improvements in MSE have been observed lead to appreciable SER improvement, especially for more complex modulation orders. The 4,096 symbol sample sizes have limited the measurements to a minimum measurable 0.000244 SER, which represents 1 symbol error out of 4,096 symbols.

FIG. 6 summarizes equalization performance, which shows the averaged percent reduction/improvement in MSE and SER from the NLD impaired data for multiple modulation orders. Note that 0% SER improvement for QPSK was because the received signal's SER was already very low.

The nonlinear equalization scheme presented by integrating the Volterra series nonlinear model with deep neural networks yields superior results over conventional nonlinear equalization approaches in mitigating nonlinear power amplifier distortions. It finds application for many 5G communication scenarios.

The technology may be implemented as an additional component in a receiver, or within the digital processing signal chain of a modern radio. A radio is described in US 20180262217, expressly incorporated herein by reference.

In an implementation, a base station may include a SDR receiver configured to allow the base station to operate as an auxiliary receiver. In an example implementation, the base station may include a wideband receiver bank and a digital physical/media access control (PHY/MAC) layer receiver. In this example, the SDR receiver may use a protocol analyzer to determine the protocol used by the source device on the uplink to the primary base station, and then configure the digital PHY/MAC layer receiver for that protocol when operating as art auxiliary receiver. Also, the digital PHY/ MAC layer receiver may be configured to operate according to another protocol when operating as a primary base station. In another example, the base station may include a receiver hank for a wireless system, for example, a fifth Generation (5G) receiver bank, and include an additional receiver having SDR configurable capability. The additional receiver may be, for example, a digital Wi-Fi receiver configurable to operate according to various Wi-Fi protocols. The base station may use a protocol analyzer to determine the particular Wi-Fi protocol used by the source device on the uplink to the primary base station. The base station may then configure the additional receiver as the auxiliary receiver for that Wi-Fi protocol.

Depending on the hardware configuration, a receiver may be used to flexibly provide uplink support in systems operating according to one or more protocols such as the various IEEE 802.11 Wi-Fi protocols, $3r^d$ Generation Cellular (3G), $4^{th}$ Generation Cellular (4G) wide band code division multiple access (WCDMA), Long Term Evolution (LTE) Cellular, and $5^{th}$ generation cellular (5G).

See, 5G References,Iinfra.

Processing unit may comprise one or more processors, or other control circuitry or any combination of processors and control circuitry that provide, overall control according to the disclosed embodiments. Memory may be implemented as any type of as any type of computer readable storage media, including non-volatile and volatile memory.

The example embodiments disclosed herein may be described in the general context of processor-executable code or instructions stored on memory that may comprise one or more computer readable storage media (e.g., tangible non-transitory computer-readable storage media such as memory). As should be readily understood, the terms "computer-readable storage media" or "non-transitory computer-readable media" include the media for storing of data, code and program instructions, such as memory, and do not include portions of the media for storing transitory propagated or modulated data communication signals.

While the functionality disclosed herein has been described by illustrative example using descriptions of the various components and devices of embodiments by referring to functional blocks and processors or processing units, controllers, and memory including instructions and code, the functions and processes of the embodiments may be implemented and performed using any type of processor, circuit, circuitry or combinations of processors and or circuitry and code. This may include, at least in part, one or more hardware logic components. For example, and without limitation, illustrative types of hardware logic components that can be used include field programmable gate arrays (FPGAs), application specific integrated circuits (ASICs), application specific standard products (ASSPs), system-on-a-chip systems (SOCs), complex programmable logic devices (CPLDs), etc. Use of the term processor or processing unit in this disclosure is mean to include all such implementations.

The disclosed implementations include a receiver, one or more processors in communication with the receiver, and memory in communication with the one or more processors, the memory comprising code that, when executed, causes the one or more processors to control the receiver to implement various features and methods according to the present technology.

Although the subject matter has been described in language specific to structural features and/or methodological acts, it is to be understood that the subject matter defined in the appended claims is not necessarily limited to the specific features or acts described above. Rather, the specific features and acts described above are disclosed as example embodiments, implementations, and forms of implementing the claims and these example configurations and arrangements may be changed significantly without departing from the scope of the present disclosure. Moreover, although the example embodiments have been illustrated with reference to particular elements and operations that facilitate the processes, these elements, and operations may be combined with or, be replaced by, any suitable devices, components, architecture or process that achieves the intended functionality of the embodiment. Numerous other changes, substitutions, variations, alterations, and modifications may be ascertained to one skilled in the art and it is intended that the present disclosure encompass all such changes, substitutions, variations, alterations, and modifications a falling within the scope of the appended claims.

REFERENCES

[1] J.-A. Lucciardi, P. Potier, G. Buscarlet, F. Barrami, and G. Mesnager, "Non-linearized amplifier and advanced mitigation techniques: Dvbs-2x spectral efficiency improvement," in GLOBECOM 2017-2017 IEEE Global Communications Conference. IEEE, 2017, pp. 1-7.

[2] J. Wood, Behavioral modeling and linearization of RF power amplifiers. Artech House, 2014.

[3] C.-L. Wang and Y. Ouyang, "Low-complexity selected mapping schemes for peak-to-average power ratio reduction in ofdm systems," IEEE Transactions on signal processing, vol. 53, no. 12, pp. 4652-4660, 2005.

[4] J. Kim and K. Konstantinou, "Digital predistortion of wideband signals based on power amplifier model with memory," Electronics Letters, vol. 37, no. 23, pp. 1417-1418, 2001.

[5] L. Ding, G. T. Zhou, D. R. Morgan, Z. Ma, J. S. Kenney, J. Kim, and C. R. Giardina, "A robust digital baseband predistorter constructed using memory polynomials," IEEE Transactions on communications, vol. 52, no. 1, pp. 159-165, 2004.

[6] M. Rawat, K. Rawat, and F. M. Ghannouchi, "Adaptive digital predistortion of wireless power amplifiers/transmitters using dynamic realvalued focused time-delay line neural networks," IEEE Transactions on Microwave Theory and Techniques, vol. 58, no. 1, pp. 95-104, 2010.

[7] S. Dimitrov, "Non-linear distortion cancellation and symbol-based equalization in satellite forward links," IEEE Trans Wireless Commun, vol. 16, no. 7, pp. 4489-4502, 2017.

[8] D. J. Sebald and J. A. Bucklew, "Support vector machine techniques for nonlinear equalization," IEEE Transactions on Signal Processing, vol. 48, no. 11, pp. 3217-3226, 2000.

[9] S. Chen, B. Mulgrew, and P. M. Grant, "A clustering technique for digital communications channel equalization using radial basis function networks," IEEE Transactions on neural networks, vol. 4, no. 4, pp. 570-590, 1993.

[10] B. Li, C. Zhao, M. Sun, H. Zhang, Z. Zhou, and A. Nallanathan, "A bayesian approach for nonlinear equalization and signal detection in millimeter-wave communications," IEEE Transactions on Wireless Communications, vol. 14, no. 7, pp. 3794-3809, 2015.

[11] F. Mkadem and S. Boumaiza, "Physically inspired neural network model for rf power amplifier behavioral modeling and digital predistortion," IEEE Transactions on Microwave Theory and Techniques, vol. 59, no. 4, pp. 913-923, 2011.

[12] T. Liu, S. Boumaiza, and F. M. Ghannouchi, "Dynamic behavioral modeling of 3g power amplifiers using real-valued time-delay neural networks," IEEE Transactions on Microwave Theory and Techniques, vol. 52, no. 3, pp. 1025-1033, 2004.

[13] M. Ibnkahla, "Applications of neural networks to digital communicationsa survey," Signal processing, vol. 80, no. 7, pp. 1185-1215, 2000.

[14] D.-C. Park and T.-K. J. Jeong, "Complex-bilinear recurrent neural network for equalization of a digital satellite channel," IEEE Transactions on Neural Networks, vol. 13, no. 3, pp. 711-725, 2002.

[15] A. Uncini, L. Vecci, P. Campolucci, and F. Piazza, "Complex-valued neural networks with adaptive spline activation function for digital-radio-links nonlinear equalization," IEEE Transactions on Signal Processing, vol. 47, no. 2, pp. 505-514, 1999.

[16] M. S. Sim, M. Chung, D. Kim, J. Chung, D. K. Kim, and C.-B. Chae, "Nonlinear self-interference cancellation for full-duplex radios: From link-level and system-level performance perspectives," IEEE Communications Magazine, vol. 55, no. 9, pp. 158-167, 2017.

[17] I. Yoffe and D. Wulich, "Predistorter for mimo system with nonlinear power amplifiers," IEEE Transactions on Communications, vol. 65, no. 8, pp. 3288-3301, 2017.

[18] M. Abdelaziz, L. Anttila, and M. Valkama, "Reduced-complexity digital predistortion for massive mimo," in Acoustics, Speech and Signal Processing (ICASSP), 2017 IEEE International Conference on. IEEE, 2017, pp. 6478-6482.

[19] H. Yan and D. Cabric, "Digital predistortion for hybrid precoding architecture in millimeter-wave massive mimo systems," in Acoustics, Speech and Signal Processing (ICASSP), 2017 IEEE International Conference on. IEEE, 2017, pp. 3479-3483.

[20] C. Mollén, E. G. Larsson, and T. Eriksson, "Waveforms for the massive mimo downlink: Amplifier efficiency, distortion, and performance," IEEE Transactions on Communications, vol. 64, no. 12, pp. 5050-5063, 2016.

[21] A. Cheaito, M. Crussière, J.-F. Hélard, and Y. Louët, "Quantifying the memory effects of power amplifiers: Evm closed-form derivations of multicarrier signals." IEEE Wireless Commun. Letters, vol. 6, no. 1, pp. 34-37, 2017.

[22] K. Simons, Technical Handbook for CATV Systems, 3rd Edition. Jerrod Publication No. 436-001-01, 1968.

[23] J. Staudinger, J.-C. Nanan, and J. Wood, "Memory fading volterra series model for high power infrastructure amplifiers," in Radio and Wireless Symposium (RWS), 2010 IEEE. IEEE, 2010, pp. 184-187.

[24] A. Zhu, J. C. Pedro, and T. J. Brazil, "Dynamic deviation reduction-based volterra behavioral modeling of rf power amplifiers," IEEE Transactions on microwave theory and techniques, vol. 54, no. 12, pp. 4323-4332, 2006.

[25] A. Zhu, P. J. Draxler, J. J. Yan, T. J. Brazil, D. F. Kimball, and P. M. Asbeck, "Open-loop digital predistorter for rf power amplifiers using dynamic deviation reduction-based volterra series," IEEE Transactions on Microwave Theory and Techniques, vol. 56, no. 7, pp. 1524-1534, 2008.

[26] L. Guan and A. Zhu, "Simplified dynamic deviation reduction-based volterra model for doherty power amplifiers," in Integrated Nonlinear Microwave and Millimetre-Wave Circuits (INMMIC), 2011 Workshop on. IEEE, 2011, pp. 1-4.

AMPLIFIER REFERENCES

Aghvami, A. H. and Robertson, I. D. [April, 1993] Power limitation and high-power amplifier non linearities in on-board satellite communications systems. Electron. and Comm. Engin. J.

Arthanayake, T. and Wood, H. B. [8 April, 1971] Linear amplification using envelope feedback. Elec. Lett.

Bennet, T. J. and Clements, R. F. [May, 1974] Feedforward—An alternative approach to amplifier linearisation. Radio and Electron. Engin.

Bhargava, V. K. et al. [1981] Digital Communications by Satellite, John Wiley and Sons.

Black, H. S. [October, 1928] Translating system. U.S. Pat. No. 1,686,792.

Black, H. S. [December, 1937] Wave translating system. U.S. Pat. No. 2,102,671.

Bond F. E. and Meyer, H. F. [April, 1970] Intermodulation effects in limiter amplifier repeaters. IEEE Trans. Comm., Vol. COM-18, p. 127-135.

Chadwick, P. [1986] Wideband Amplifier Applications Book, Edition 2, Plessey Semiconductor.

Cole, R. A. [December, 1989] Linearisation of a power amplifier using Cartesian Loop feedback. Report No. 72/89/R/451/C. Roke Manor Res.

ETSI [August, 1994] Standard ETR 132. Radio broadcasting systems; Code of practice for site engineering VHF FM sound broadcasting transmitters. European Telecommunications Standards Institute, Sophia Antipolis, F-06291, Valbonne Cedex, France.

ETSI [January, 1995] European Standard ETS 300 384. Radio broadcasting systems; Very high frequency (VHF), frequency modulated, sound broadcasting transmitters. European Telecommunications Standards Institute, Sophia Antipolis, F-06291, Valbonne Cedex, France.

ETSI [March, 1997] European Standard ETS 300 113. Radio equipment and systems (RES); Land mobile service; Technical characteristics and test conditions for radio equipment intended for the transmission of data (and speech) and having an antenna connector. European Telecommunications Standards Institute, Sophia Antipolis, F-06291, Valbonne Cedex, France.

ETSI [June, 1998] Standard ETR 053 Ed 3 Radio site engineering for equipment and systems in the mobile service. European Telecommunications Standards Institute, Sophia Antipolis, F-06291, Valbonne Cedex, France.

Gray, L. F. [1980] Application of broadband linearisers to satellite transponders. IEEE Conf. Proc. ICC'80.

Heathman, A. C. [1989] Methods for intermodulation prediction in communication systems. Ph. D. Thesis, University of Bradford, United Kingdom.

IESS [November, 1996] IESS-401 (Rev. 4). Performance requirements for intermodulation products transmitted from INTELSAT earth stations. Intelsat Earth Station Standard (IESS).

Kaeadar, K. [December, 1986] Gaussian white-noise generation for digital signal synthesis. IEEE Trans. Inst. and Meas., Vol. IM 35, 4.

Kahn, L. R. [July, 1952] SSB transmission by envelope elimination and restoration. Proc. IRE.

Mitchell, A. F. [November, 1979] A 135 MHz feedback amplifier. IEEE Colloq. Broadband High Frequency Amplifiers.

Petrovic, V. and Gosling, W. [10 May, 1979] Polar loop transmitter. Elec. Lett.

Pye Telecom [November, 1978] Intermodulation in VHF and UHF radio systems locating and minimizing the effects. Engineering Notes, Pub. Ref. No. TSP480/1, United Kingdom.

RA [April, 1987] Code of practice for radio site engineering. MPT 1331. Radiocommunications Agency (RA) United Kingdom.

Saleh, A. M. [May 1982] Intermodulation analysis of FDMA satellite systems employing compensated and uncompensated TWT's'. IEEE Trans. Comm., Vol. COM-30, 5.

Schetzen, M. [1980] The Volterra and Wiener Theories of Non-linear Systems. Wiley & Sons.

Shahid, M., Shepherd, S. J., Lin, B., Khairruddin, I., and Barton, S. K. [December, 1996] Study of methods of measuring multi-carrier intermodulation performance Report No. 581, Purchase Order No. 142379 d'ESA, with University of Bradford, United Kingdom.

Shimbo, 0. [February, 1971] Effects of intermodulation, AM-PM conversion, and additive noise in multicarrier TWT systems. Proc. IEEE, Vol. 59, p. 230-238.

Smith, C. N. [1986] Application of the polar loop technique to UHF SSB transmitters. Ph.D. Thesis, University of Bath.

Smith, C. N. and PETROVIC, V. [1982] Cartesian loop transmitter. Internal Research Report, University of Bath, School of Electrical and Electronic Engineering.

Tondryk, W. [1991] Intermodulation testing of the INMARSAT payload—Response to system PDR. Marconi Space Systems Ltd.

Wassermann, M. et al. [1983] Study and breadboarding of an L-band high power linearized TWT amplifier. Final Report, ESTEC contract No. 5459/83/NL/GM.

Wood, A. [October 1998] Radio interference: Sources and solutions. LPRA NEWS, p. 21.

Pavliouk, A. [1977] Unification of measurement procedures for out-of-band emission spectra and peak envelope power of single-sideband radio transmitter measurements. Proc. of the NIIR, 4 (in Russian).

Schetzen, M. [1980] *The Volterra and Wiener Theories of Non-linear Systems.* Wiley & Sons.

VOLTERRA SERIES REFERENCES

Bohm, D. The Special Theory of Relativity, Benjamin, 1965.

Sonnenschein, M & Censor, D., 1998, Simulation of Hamiltonian light beam propagation in nonlinear media, *JOSA-Journal of the Optical Society of America B*, (15): 1335-1345

Censor, D., 2000, A quest for systematic constitutive formulations for general field and wave systems based on the Volterra differential operators, *PIER—Progress In Electromagnetics Research,* (25): 261-284

Censor, D., 2001, Constitutive relations in inhomogeneous systems and the particle-field conundrum, *PIER—Progress In Electromagnetics Research,* (30): 305-335

Censor, D., & Melamed, T, 2002, Volterra differential constitutive operators and locality considerations in electromagnetic theory, *PIER—Progress in Electromagnetic Research,* 36: 121-137

Schetzen, M., 1980, *The Volterra and Wiener Theorems of Nonlinear Systems,* New York, Chichester, Brisbane and Toronto: John Wiley and Sons

FILTER REFERENCES

Rai, Amrita, and Amit Kumar Kohli. "Analysis of Adaptive Volterra Filters with LMS and RLS Algorithms." AKGEC Journal of Technology 2, no. 1 (2011).

Simon Haykin, "Adaptive Filter Theory", Fourth Edition, Pearson Education, 2008.

V. John Mathews, "Adaptive Polynomial Filters", *IEEE SP Magazine, July* 1991.

John Leis, "Adaptive Filter Lecture Notes & Examples", Nov. 1, 2008 www.usq.edu.au/users/leis/notes/sigproc/adfilt.pdf .

Tuncer C. Aysal and Kenneth E. Barner, "Myriad-Type Polynomial Filtering", *IEEE Transactions on Signal Processing,* vol. 55, no. 2, February 2007.

Ezio Biglieri, Sergio Barberis, and Maurizio Catena, "Analysis and Compensation of Nonlinearities in Digital Transmission Systems", *IEEE Journal on selected areas in Communications,* vol. 6, no. 1, January 1988.

Roberto López-Valcarce and Soura Dasgupta, "Second-Order Statistical Properties of Nonlinearly Distorted Phase-Shift Keyed (PSK) Signals", *IEEE Communications Letters, vol.* 7, no. 7, July 2003.

Dong-Chul Park and Tae-Kyun Jung Jeong, "Complex-Bilinear Recurrent Neural Network for Equalization of a Digital Satellite Channel", *IEEE Transactions on Neural Networks, vol.* 13, no. 3, May 2002.

John Tsimbinos and Langford B. White, "Error Propagation and Recovery in Decision-Feedback Equalizers for Nonlinear Channels", *IEEE Transactions on Communications*, vol. 49, no. 2, February 2001.

Christoph Krall, Klaus Witrisal, Geert Leus and Heinz Koeppl, "Minimum Mean-Square Error Equalization for Second-Order Volterra Systems", *IEEE Transactions on Signal Processing*, vol. 56, no. 10, October 2008.

Alexandre Gurin, Gerard Faucon, and Regine Le Bouquin-Jeannes, "Nonlinear Acoustic Echo Cancellation Based on Volterra Filters", *IEEE Transactions on Speech and Audio Processing*, vol. 11, no. 6, November 2003.

Yang-Wang Fang, Li-Cheng Jiao, Xian-Da Zhang and Jin Pan, "On the Convergence of Volterra Filter Equalizers Using a Pth-Order Inverse Approach", *IEEE Transactions on Signal Processing*, vol. 49, no. 8, August 2001.

Kenneth E. Barner and Tuncer Can Aysal, "Polynomial Weighted Median Filtering", *IEEE Transactions on Signal Processing*, vol. 54, no. 2, February 2006.

Georgeta Budura and Corina Botoca, "Efficient Implementation of the Third Order RLS Adaptive Volterra Filter", *FACTA Universitatis (NIS) Ser.: Elec. Energ.* vol. 19, no. 1, April 2006.

A. Zaknich, "Principal of Adaptive Filter and Self Learning System", Springer Link 2005.

Charles W. Therrien, W. Kenneth Jenkins, and Xiaohui Li, "Optimizing the Performance of Polynomial Adaptive Filters: Making Quadratic Filters Converge Like Linear Filters", IEEE Transactions on Signal Processing, vol. 47, no. 4, April 1999.

Young Yun Woo et al. "Adaptive Digital Feedback Predistortion Technique for Linearizing Power Amplifiers," IEEE Transactions on Microwave Theory and Techniques, Vol. 55, No. 5, May 2007.

Altera Corporation. Digital Predistortion Reference Design. Application Note 314, 2003.

J. Kim and K. Konstantinou. "Digital predistortion of wideband signals based on power amplifier model with memory," Electronic Letters, Vol. 37, No. 23, Nov. 2001.

L. Ding et al. "A Robust Digital Baseband Predistorter Constructed Using Memory Polynomials," IEEE Transactions on Communications, Vol. 52, No. 1, June 2004.

V. John Mathews, "Adaptive Polynomial Filters," IEEE Signal Processing Magazine, Vol. 8, No. 3, July 1991.

N. Kamiya and F. Maehara. "Nonlinear Distortion Avoidance Employing Symbol-wise Transmit Power Control for OFDM Transmission," Proc. of Intl. OFDM Workshop, Hamburg, 2009.

Y. Akaiwa. Introduction to Digital Mobile Communication. New York: Wiley, 1997.

Lozhkin, Alexander N. "Turbo Linearizer for High Power Amplifier." In 2011 IEEE 73rd Vehicular Technology Conference (VTC Spring), pp. 1-5. IEEE, 2011.

VOLTERRA SERIES PATENTS

U.S. Patent and Published Patent Application Nos.: U.S. Pat. Nos. 4,615,038; 4,669,116; 4,8703,71; 5,038,187; 5,309,481; 5,329,586; 5,424,680; 5,438,625; 5,539,774; 5,647,023; 5,692,011; 5,694,476; 5,744,969; 5,745,597; 5,790,692; 5,792,062; 5,815,585; 5,889,823; 5,924,086; 5,938,594; 5,991,023; 6,002,479; 6,005,952; 6,064,265; 6,166,599; 6,181,754; 6,201,455; 6,201,839; 6,236,837; 6,240,278; 6,288,610; 6,335,767; 6,351,740; 6,381,212; 6,393,259; 6,406,438; 6,408,079; 6,438,180; 6,453,308; 6,504,885; 6,510,257; 6,512,417; 6,532,272; 6,563,870; 6,600,794; 6,633,208; 6,636,115; 6,668,256; 6,687,235; 6,690,693; 6,697,768; 6,711,094; 6,714,481; 6,718,087; 6,775,646; 6,788,719; 6,812,792; 6,826,331; 6,839,657; 6,850,871; 6,868,380; 6,885,954; 6,895,262; 6,922,552; 6,934,655; 6,940,790; 6,947,857; 6,951,540; 6,954,476; 6,956,433; 6,982,939; 6,992,519; 6,999,201; 6,999,510; 7,007,253; 7,016,823; 7,061,943; 7,065,511; 7,071,797; 7,084,974; 7,092,043; 7,113,037; 7,123,663; 7,151,405; 7,176,757; 7,209,566; 7,212,933; 7,236,156; 7,236,212; 7,239,301; 7,239,668; 7,251,297; 7,268,620; 7,272,594; 7,286,009; 7,295,961; 7,304,591; 7,305,639; 7,308,032; 7,333,559; 7,348,844; 7,400,807; 7,403,884; 7,412,469; 7,423,699; 7,436,883; 7,443,326; 7,489,298; 7,512,900; 7,542,518; 7,551,668; 7,570,856; 7,571,401; 7,576,606; 7,589,725; 7,590,518; 7,602,240; 7,606,539; 7,610,183; 7,657,405; 7,720,232; 7,720,236; 7,728,658; 7,729,446; 7,733,177; 7,746,955; 7,755,425; 7,760,887; 7,773,692; 7,7741,76; 7,795,858; 7,796,960; 7,808,315; 7,812,666; 7,821,337; 7,821,581; 7,822,146; 7,826,624; 7,847,631; 7,852,913; 7,853,443; 7,864,881; 7,873,172; 7,885,025; 7,885,797; 7,889,007; 7,894788; 7,895,006; 7,899,416; 7,902,925; 7,903,137; 7,924,942; 7,929,375; 7,932,782; 7,970,150; 7,970,151; 7,979,837; 7,991,073; 7,991,167; 7,995,674; 8,005,858; 8,023,668; 8,031,882; 8,039,871; 8,045,066; 8,046,199; 8,065,060; 8,089,689; 8,105,270; 8,139,630; 8,148,983; 8,149,950; 8,160,191; 8,165,854; 8,170,508; 8,185,853; 8,193,566; 8,195,103; 8,199,399; 8,213,880; 8,244,787; 8,260,732; 8,265,583; 8,270,530; 8,294,605; 8,295,790; 8,306,488; 8,310,312; 8,315,970; 8,331,511; 8,331,879; 8,345,348; 8,346,692; 8,346,693; 8,346,711; 8,346,712; 8,351,876; 8,354,884; 8,355,684; 8,358,169; 8,364,095; 8,369,447; 8,369,595; 8,380,773; 8,390,375; 8,390,376; 8,396,693; 8,410,843; 8,410,850; 8,412,133; 8,421,534; 8,432,220; 8,437,513; 8,463,582; 8,467,438; 8,477,581; 8,483,343; 8,483,450; 8,487,706; 8,489,047; 8,494,463; 8,498,369; 8,509,347; 8,509,712; 8,519,440; 8,532,215; 8,532,964; 8,538,039; 8,564,368; 8,565,343; 8,577,311; 8,587,375; 8,599,050; 8,605,814; 8,605,819; 8,611,190; 8,611,459; 8,611,820; 8,615,208; 8,619,905; 8,620,631; 8,626,089; 8,649,743; 8,675,925; 8,704,595; 8,705,166; 8,712,345; 8,718,178; 8,718,209; 8,724,857; 8,737,937; 8,737,938; 8,744,141; 8,744,377; 8,758,271; 8,761,409; 8,766,917; 8,767,869; 8,780,693; 8,787,628; 8,798,559; 8,804,807; 8,804,871; 8,811,532; 8,823,452; 8,831,074; 8,831,133; 8,831,135; 8,838,218; 8,843,088; 8,843,089; 8,849,611; 8,855,175; 8,855,234; 8,867,601; 8,874,411; 8,885,765; 8,886,341; 8,891,701; 8,896,471; 8,897,351; 8,903,192; 8,909,176; 8,909,328; 8,933,752; 8,934,573; 8,958,470; 8,964,901; 8,964,996; 8,971,834; 8,976,896; 8,994,657; 8,995,571; 8,995,835; 9,008,153; 9,014,299; 9,019,643; 9,020,454; 9,025,607; 9,031,168; 9,036,734; 9,048,865; 9,048,900; 9,071,313; 9,077,508; 9,088,472; 9,094,036; 9,094,151; 9,104,921; 9,106,304; 9,130,628; 9,137,492; 9,143,274; 9,160,280; 9,160,310; 9,160,687; 9,166,610; 9,166,635; 9,166,698; 9,171,534; 9,184,784; 9,185,529; 9,189,458; 9,191,041; 9,191,049; 9,199,860; 9,209,753; 9,209,841; 9,214,968; 9,214,969; 9,225,295; 9,225,501; 9,231,530; 9,231,647; 9,231,801; 9,236,996; 9,246,525; 9,246,731; 9,252,798; 9,252,821; 9,253,608; 9,257,943; 9,258,156; 9,261,978; 9,264,153; 9,265,461; 9,270,304; 9,270,512; 9,271,123; 9,276,602; 9,294,113; 9,304,501; 9,306,606; 9,311,535; 9,312,892; 9,314,623; 9,322,906; 9,337,781; 9,337,783; 9,352,155; 9,361,681; 9,361,936; 9,362,869; 9,362,942; 9,363,068; 9,369,093; 9,369,255; 9,369,541; 9,397,516; 9,404,950; 9,413,516; 9,419,722; 9,431,972; 9,438,178; 9,438,356; 9,439,597; 9,451,920; 9,460,246; 9,461,597; 9,461,676; 9,473,077; 9,479,322; 9,509,331; 9,509,350; 9,517,030; 9,531,475; 9,536,539; 9,537,759; 9,544,126; 9,559,831; 9,564,876; 9,571,312; 9,575,570; 9,590,664;

9,590,668; 9,595,920; 9,595,982; 9,607,003; 9,607,628; 9,608,676; 9,608,718; 9,614,554; 9,628,119; 9,628,120; 9,646,116; 9,647,717; 9,654,211; 9,654,216; 9,659,120; 9,660,593; 9,660,730; 9,665,510; 9,667,292; 9,674,368; 9,680,423; 9,680,497; 9,697,845; 9,705,477; 9,706,296; 9,712,179; 9,712,233; 9,713,010; 9,722,646; 9,722,691; 9,726,701; 9,727,677; 9,735,741; 9,735,800; 9,735,811; 9,735,876; 9,737,258; 9,742,599; 9,746,506; 9,749,161; 9,755,691; 9,762,268; 9,768,891; 9,778,902; 9,780,869; 9,780,881; 9,787,459; 9,794,000; 9,800,437; 9,800,734; 9,820,311; 9,831,899; 9,837,970; 9,843,346; 9,859,845; 9,866,183; 9,877,265; 9,882,648; 9,887,862; 9,900,088; 9,912,435; 9,913,194; 9,923,524; 9,923,640; 9,923,714; 9,928,212; 9,935,590; 9,935,645; 9,935,715; 9,935,761; 9,940,938; 9,941,963; 9,9536,56; 9,954,384; 9,960,794; 9,960,804; 9,960,900; 9,971,920; 9,973,279; 9,974,957; 9,983,243; 9,998,223; 9,998,406; 9,999,780; Ser. Nos. 10/008,218; 10/009,050; 10/009,109; 10/009,259; 10/013,515; 10/015,593; 10/033,413; 10/033,568; 10/050,636; 10/050,710; 10/050,714; 10/063,265; 10/063,364; 10/075,201; 10/095,927; 10/097,273; 10/097,939; 10,101,370; 10/108,858; 10/110,315; 10/116,390; 10/128,955; 10/141,944; 10/142,754; 10/147,431; 10/148,417; 10/153,793; 10/181,825; 10/224,970; 20010036334; 20010051871; 20020041210; 20020060827; 20020075918; 20020126604; 20020146993; 20020161539; 20020161542; 20020169585; 20020178133; 20020181521; 20020186874; 20030046045; 20030057963; 20030063854; 20030071684; 20030142832; 20030195706; 20030223507; 20040019443; 20040044489; 20040130394; 20040136423; 20040155707; 20040179629; 20040208242; 20040258176; 20050021266; 20050021319; 20050031117; 20050031131; 20050031132; 20050031133; 20050031134; 20050031137; 20050031138; 20050031139; 20050031140; 20050049838; 20050100065; 20050141637; 20050141659; 20050174167; 20050177805; 20050180526; 20050226316; 20050237111; 20050243061; 20050253806; 20050270094; 20050271216; 20050273188; 20060039498; 20060052988; 20060083389; 20060093128; 20060095236; 20060104395; 20060104451; 20060133536; 20060209982; 20060222128; 20060239443; 20060256974; 20060262942; 20060262943; 20060264187; 20060269074; 20060269080; 20060274904; 20070005326; 20070018722; 20070030076; 20070033000; 20070063770; 20070080841; 20070133713; 20070133719; 20070136018; 20070136045; 20070152750; 20070160221; 20070168100; 20070190952; 20070229154; 20070237260; 20070247425; 20070252651; 20070252813; 20070276610; 20080001947; 20080032642; 20080129379; 20080130787; 20080130788; 20080130789; 20080152037; 20080158154; 20080158155; 20080180178; 20080240325; 20080261541; 20080283882; 20080285640; 20080293372; 20090003134; 20090027117; 20090027118; 20090058521; 20090067643; 20090072901; 20090075610; 20090094304; 20090146740; 20090153132; 20090185613; 20090256632; 20090287624; 20090289706; 20090291650; 20090302938; 20090302940; 20090318983; 20100007489; 20100033180; 20100060355; 20100090762; 20100093290; 20100094603; 20100097714; 20100114813; 20100135449; 20100148865; 20100152547; 20100156530; 20100183106; 20100194474; 20100199237; 20100254450; 20100283540; 20100292602; 20100292752; 20100311361; 20100312495; 20110003570; 20110025414; 20110028859; 20110037518; 20110054354; 20110054355; 20110064171; 20110069749; 20110081152; 20110085678; 20110087341; 20110096865; 20110102080; 20110103455; 20110110473; 20110121897; 20110125684; 20110125685; 20110125686; 20110125687; 20110140779; 20110144961; 20110149714; 20110177956; 20110181360; 20110204975; 20110211842; 20110268226; 20110270590; 20110293051; 20120007153; 20120007672; 20120027070; 20120029663; 20120086507; 20120093376; 20120098481; 20120098596; 20120119810; 20120140860; 20120147993; 20120154040; 20120154041; 20120158384; 20120165633; 20120176190; 20120176609; 20120217557; 20120229206; 20120256687; 20120259600; 20120263256; 20120306573; 20120328128; 20130005283; 20130009702; 20130015917; 20130030239; 20130034188; 20130040587; 20130044791; 20130044836; 20130093676; 20130113559; 20130114762; 20130166259; 20130170842; 20130176153; 20130207723; 20130222059; 20130243119; 20130243122; 20130243135; 20130257530; 20130271212; 20130272367; 20130285742; 20130301487; 20130303103; 20130315291; 20130321078; 20130330082; 20130336377; 20140009224; 20140029658; 20140029660; 20140030995; 20140031651; 20140036969; 20140044318; 20140044319; 20140044320; 20140044321; 20140072074; 20140077981; 20140081157; 20140086356; 20140086361; 20140095129; 20140107832; 20140126670; 20140126675; 20140133848; 20140140250; 20140161207; 20140167704; 20140172338; 20140198959; 20140213919; 20140225451; 20140226828; 20140229132; 20140247906; 20140266431; 20140269857; 20140269970; 20140269989; 20140269990; 20140270405; 20140278303; 20140279778; 20140292406; 20140292412; 20140294119; 20140294252; 20140313946; 20140314176; 20140314181; 20140314182; 20140317163; 20140323891; 20140333376; 20140372091; 20150003625; 20150005902; 20150016567; 20150018632; 20150025328; 20150031317; 20150031969; 20150032788; 20150043678; 20150051513; 20150061911; 20150070089; 20150077180; 20150078484; 20150092830; 20150098710; 20150104196; 20150131757; 20150156003; 20150156004; 20150162881; 20150172081; 20150180495; 20150193565; 20150193666; 20150194989; 20150202440; 20150214987; 20150215937; 20150223748; 20150241996; 20150249889; 20150256216; 20150270856; 20150270865; 20150288375; 20150295643; 20150311927; 20150311973; 20150311985; 20150322647; 20150326190; 20150333781; 20150357975; 20150358042; 20150358191; 20150381216; 20150381220; 20150381821; 20160005419; 20160022161; 20160028433; 20160034421; 20160036472; 20160036528; 20160065311; 20160079933; 20160087604; 20160087657; 20160099776; 20160111110; 20160117430; 20160124903; 20160126903; 20160167113; 20160132735; 20160134380; 20160156375; 20160162042; 20160173117; 20160191020; 20160218752; 20160225385; 20160241277; 20160248531; 20160259960; 20160261241; 20160269210; 20160287871; 20160308619; 20160309042; 20160316283; 20160329927; 20160334466; 20160336762; 20160352427; 20160359552; 20160373212; 20160380661; 20160380700; 20170012585; 20170012709; 20170014032; 20170032184; 20170033809; 20170041124; 20170043166; 20170047899; 20170061045; 20170063312; 20170077944; 20170077945; 20170078023; 20170078027; 20170093497; 20170095195; 20170104503; 20170108943; 20170117854; 20170141807; 20170141938; 20170163465; 20170170999; 20170180061; 20170195053; 20170207934; 20170214468; 20170214470; 20170222717; 20170244582; 20170245054; 20170245079; 20170255593; 20170272283; 20170304625; 20170322243; 20170324421; 20170338841; 20170338842; 20170339569; 20170346510; 20170366209; 20170366259; 20170373647; 20170373759; 20180013456; 20180013495; 20180026586; 20180026673; 20180041219; 20180062674; 20180070394; 20180102850; 20180131502; 20180167042; 20180167092; 20180167093; 20180180420; 20180191448; 20180219566; 20180254769; 20180262370; 20180269988; 20180279197; 20180294879; 20180294884; 20180302111; 20180309465; 20180316320; 20180331814; 20180333580; 20180367219; 20190007075; 20190013867;

20190013874; 20190013991; 20190020415; 20190028131; 20190030334; 20190036622; and 20190042536.

5G REFERENCES

U.S. Pat. Nos. 6,675,125; 6,778,966; 7,027,981; 7,190,292; 7,206,420; 7,212,640; 7,558,391; 7,865177; 8,085,943; 8,599,014; 8,725,706; 8,776,625; 8,898,567; 8,989,762; 9,160,579; 9,203,654; 9,235,268; 9,401,823; 9,432,564; 9,460,617; 9,531,427; 9,544,006; 9,564,927; 9,565,045; 9,613,408; 9,621,387; 9,660,851; 9,680,670; 9,686,112; 9,712,238; 9,712,350; 9,712,354; 9,713,019; 9,722,318; 9,729,281; 9,729,378; 9,742,521; 9,749,083; 9,774,476; 9,859,981; 9,871,679; 9,876,530; 9,877,206; 9,882,608; 9893,919; 9,899,182; 9,900,048; 9,900,122; 9,900,123; 9,900,190; 9,912,436; 9,9297,55; 9,942074; 9,998,172; 9,998,187; Ser. Nos. 10/003,364; 10/027,397; 10/027,427; 10/027,523; 10/033,107; 10/033,108; 10/050,815; 10/051,483; 10/051,488; 10/062,970; 10/063,354; 10/069,467; 10/069,535; 10/079,652; 10/084,562; 10/090,594; 10/096,883; 10/103,777; 10/123,217; 10/129,057; 10/135,145; 10/148,016; 10/148,360; 10/168,501; 10/170,840; 10/171,158; 10/191,376; 10/198,582; 10/200,106; 10/205,212; 10/205,231; 10/205,482; 10/205,655; 10/211,855; 10/212,014; 10/218,405; 10/224,634; 20020051546; 20020085725; 20020103619; 20020172374; 20020172376; 20020172378; 20030035549; 20030055635; 20030098805; 20030112088; 20090221257; 20110238690; 20110249024; 20110252320; 20110288457; 20120112908; 20130110974; 20130201316; 20140226035; 20150146805; 20150146806; 20150230105; 20150280945; 20150310739; 20160093029; 20160149665; 20160149731; 20160197642; 20160218891; 20160226681; 20160352361; 20160352362; 20160352419; 20170012862; 20170018851; 20170018852; 20170019131; 20170026095; 20170032129; 20170033465; 20170033466; 20170033953; 20170033954; 20170063430; 20170078400; 20170085003; 20170085336; 20170093693; 20170104617; 20170110795; 20170110804; 20170111805; 20170134205; 20170201288; 20170229782; 20170230083; 20170245157; 20170269481; 20170271117; 20170288917; 20170295048; 20170311307; 20170317781; 20170317782; 20170317783; 20170317858; 20170318482; 20170331899; 20180013452; 20180034912; 20180048497; 20180054232; 20180054233; 20180054234; 20180054268; 20180062886; 20180069594; 20180069731; 20180076947; 20180076979; 20180076982; 20180076988; 20180091195; 20180115040; 20180115058; 20180123256; 20180123257; 20180123749; 20180123836; 20180123856; 20180123897; 20180124181; 20180131406; 20180131541; 20180145411; 20180145412; 20180145414; 20180145415; 20180151957; 20180152262; 20180152330; 20180152925; 20180159195; 20180159196; 20180159197; 20180159228; 20180159229; 20180159230; 20180159232; 20180159240; 20180159243; 20180159615; 20180166761; 20180166784; 20180166785; 20180166787; 20180167105; 20180167148; 20180175892; 20180175978; 20180198668; 20180205399; 20180205481; 20180227158; 20180248592; 20180254754; 20180254924; 20180262243; 20180278693; 20180278694; 20180294897; 20180301812; 20180302145; 20180309206; 20180323826; 20180324005; 20180324006; 20180324021; 20180324601; 20180331413; 20180331720; 20180331721; 20180333871; 20180343304; 20180351687; 20180358678; 20180359126; 20180375940; 20190013577; 20190013837; 20190013838; 20190020530; 20190036622; 20190052505; 20190074563; 20190074564; 20190074565; 20190074568; 20190074580; 20190074584; 20190074597; 20190074598; 20190074864; 20190074865; and 20190074878.

The invention claimed is:

1. A radio receiver, comprising:
an input configured to receive a distorted transmitted radio frequency signal representing a set of symbols communicated through a communication channel;
a Volterra series processor configured to decompose the distorted transmitted radio frequency signal as a Volterra series expansion;
an equalizer, comprising a deep neural network trained with respect to channel distortion of training symbols, receiving the Volterra series expansion; and
an output, configured to present data corresponding to a reduced distortion of the received distorted transmitted radio frequency signal, dependent on the equalizer.

2. The radio receiver according to claim 1, wherein the Volterra series expansion comprises at least third order terms.

3. The radio receiver according to claim 1, wherein the Volterra series expansion comprises at least fifth order terms.

4. The radio receiver according to claim 1, wherein the deep neural network comprises at least two convolutional network hidden layers.

5. The radio receiver according to claim 1, wherein the deep neural network comprises at least three one-dimensional hidden layers, each layer having at least 10 feature maps.

6. The radio receiver according to claim 5, wherein the deep neural network further comprises a fully connected layer subsequent to the at least three one-dimensional layers.

7. The radio receiver according to claim 1, wherein the distorted transmitted radio frequency signal comprises an orthogonal frequency multiplexed signal.

8. The radio receiver according to claim 1, wherein the distorted transmitted radio frequency signal comprises a QAM signal having at least 64 modulation states.

9. The radio receiver according to claim 1, wherein the distorted transmitted radio frequency signal comprises a quadrature phase shift keying (QPSK) signal.

10. The radio receiver according to claim 1, further comprising a demodulator, configured to demodulate the output as the set of symbols.

11. An equalizer for a radio receiver, comprising:
a memory configured to store parameters for decomposition of a received radio frequency signal as a Volterra series expansion, the received radio frequency signal comprising symbols distorted by radio frequency channel distortion;
a deep neural network comprising a plurality of neural network hidden layers and at least one fully connected neural network layer, the deep neural network being trained with respect to the radio frequency channel distortion with training data comprising symbols distorted by radio frequency channel distortion labelled with their respective training symbols, the deep neural network, the deep neural network receiving the Volterra series expansion of the received radio frequency signal; and
an output configured to present an output of the deep neural network.

12. A radio reception method, comprising:
receiving a radio frequency signal representing a set of symbols communicated through a communication channel, the radio frequency signal having channel distortion with respect to the represented set of symbols;
decomposing the distorted radio frequency signal as a Volterra series expansion;

equalizing the Volterra series expansion with a deep neural network trained with respect to the channel distortion with training data comprising training symbols and corresponding training symbols having channel distortion with respect to training symbols; and presenting data corresponding to a representation of the received transmitted radio frequency signal having reduced channel distortion.

13. The method according to claim 12, wherein the Volterra series expansion comprises at least third order terms.

14. The method according to claim 12, wherein the deep neural network comprises at least two convolutional network hidden layers.

15. The method according to claim 12, wherein the deep neural network comprises at least three one-dimensional convolutional network hidden layers, each layer having at least 10 feature maps, and a fully connected layer subsequent to the at least three one-dimensional convolutional network hidden layers.

16. The method according to claim 12, wherein the transmitted radio frequency signal comprises an orthogonal frequency multiplexed signal.

17. The method according to claim 12, wherein the transmitted radio frequency signal comprises a quadrature amplitude multiplexed (QAM) signal.

18. The method according to claim 12, wherein the distorted transmitted radio frequency signal comprises a quadrature phase shift keying (QPSK) signal.

19. The method according to claim 12, further comprising demodulating the set of symbols.

20. The radio receiver according to claim 1, wherein the Volterra series expansion models a nonlinearity of a radio frequency power amplifier, wherein the Volterra series has a general model $$y(n) = \sum_{d=0}^{D} \sum_{p=0}^{P} b_{kd} x(n-d) |x(n-d)|^{k-1},$$

wherein:

x(n) is the input signal, and y(n) is the output signal, $b_{kd}$ are optimized coefficients, k is a non-linearity order, P is the order of nonlinearity, and D is a step value.

* * * * *